(12) United States Patent
Chiu et al.

(10) Patent No.: US 12,494,422 B2
(45) Date of Patent: Dec. 9, 2025

(54) SEMICONDUCTOR STRUCTURE AND METHOD FOR FORMING THE SEMICONDUCTOR STRUCTURE

(71) Applicant: Taiwan Semiconductor Manufacturing Company, Ltd., Hsinchu (TW)

(72) Inventors: Chih-Pin Chiu, Hsinchu (TW); Liang-Wei Wang, Hsinchu (TW); Chen-Chiu Huang, Taichung (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 642 days.

(21) Appl. No.: 17/733,295

(22) Filed: Apr. 29, 2022

(65) Prior Publication Data
US 2023/0352395 A1    Nov. 2, 2023

(51) Int. Cl.
| H01L 23/522 | (2006.01) |
| H01L 23/00 | (2006.01) |
| H10D 1/68 | (2025.01) |

(52) U.S. Cl.
CPC .......... *H01L 23/5223* (2013.01); *H01L 24/02* (2013.01); *H01L 24/05* (2013.01); *H01L 24/13* (2013.01); *H10D 1/692* (2025.01); *H01L 2224/02311* (2013.01); *H01L 2224/0235* (2013.01); *H01L 2224/02372* (2013.01); *H01L 2224/0401* (2013.01); *H01L 2224/05024* (2013.01); *H01L 2224/13026* (2013.01); *H01L 2924/1205* (2013.01)

(58) Field of Classification Search
CPC ......... H01L 21/76805; H01L 21/76831; H01L 21/76885; H01L 23/5226; H01L 23/5223; H01L 2224/0235; H01L 2224/0234; H01L 2924/1205; H01L 2224/02372; H01L 2224/05024; H01L 21/76829; H01L 21/76841; H01L 21/768–76898; H01L 23/481; H01L 2225/06541; H01J 1/312; H01B 63/22; H10B 61/10; H10B 61/20; H10B 61/22; H10D 1/692
See application file for complete search history.

(56) References Cited

U.S. PATENT DOCUMENTS

| 2005/0245071 A1* | 11/2005 | Wu | H01L 21/76802 |
| | | | 438/627 |
| 2009/0073633 A1* | 3/2009 | Tews | H01L 23/5223 |
| | | | 29/25.42 |
| 2009/0197404 A1* | 8/2009 | Yang | H01L 21/76808 |
| | | | 257/E21.585 |

(Continued)

*Primary Examiner* — Julio J Maldonado
*Assistant Examiner* — Paul A Berry
(74) *Attorney, Agent, or Firm* — Birch, Stewart, Kolasch & Birch, LLP

(57) ABSTRACT

A method for forming a semiconductor structure includes forming a metal-insulator-metal (MIM) structure between first passivation layers over a substrate. The method also includes forming a via structure through the MIM structure and the first passivation layers. The method also includes planarizing the via structure. The method also includes forming an RDL structure over the via structure. The method also includes forming a second passivation layer over the RDL structure and the first passivation layers.

20 Claims, 37 Drawing Sheets

(56) References Cited

U.S. PATENT DOCUMENTS

| | | | |
|---|---|---|---|
| 2013/0285257 A1* | 10/2013 | Lee | H01L 24/08 |
| | | | 257/774 |
| 2014/0264824 A1* | 9/2014 | Lu | H01L 24/05 |
| | | | 257/734 |
| 2019/0157378 A1* | 5/2019 | Luo | H10D 84/212 |
| 2020/0035596 A1* | 1/2020 | Kao | H01L 24/05 |
| 2020/0083094 A1* | 3/2020 | Ding | H01L 21/76831 |
| 2020/0402924 A1* | 12/2020 | Wu | H01L 23/5223 |

* cited by examiner

SEMICONDUCTOR STRUCTURE AND METHOD FOR FORMING THE SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 6-1, 6-2, 6-3 and 6-4 are top views of a semiconductor structure, in accordance with some embodiments of the disclosure.

DETAILED DESCRIPTION

Figure 1A:
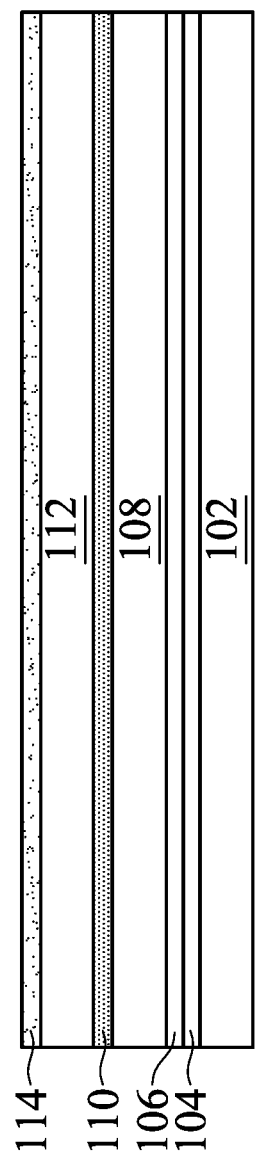
FIGS. 1A-1Q are cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Metal-insulator-metal (MIM) capacitors have been widely used in functional circuits such as mixed signal circuits, analog circuits, radio frequency (RF) circuits, dynamic random-access memories (DRAMs), embedded DRAMs, and logic operation circuits. In system-on-chip (SOC) applications, different capacitors for different functional circuits are integrated on the same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, a MIM capacitor includes a sandwich structure of interleaving metal layers and insulator layers. An exemplary MIM capacitor includes a bottom conductor plate layer, a middle conductor plate layer over the bottom conductor plate layer, and a top conductor plate layer over the middle conductor plate layer, each of which is insulated from the adjacent conductor plate layer by a dielectric layer.

Embodiments for forming a semiconductor structure are provided. The method for forming the semiconductor structure may include forming a via structure through the MIM structures and an RDL structure separately. After forming the via structure, a planarization process is performed and the RDL structure material may be deposited. Therefore, the top surface of the RDL structure may be flat and the defect formed in the RDL structure may be reduced. By forming the via structure with different deposition processes, the thickness of the passivation layers beneath and over the MIM structure may be not limited, and the MIM structure may be more robust.

Figure 1B:
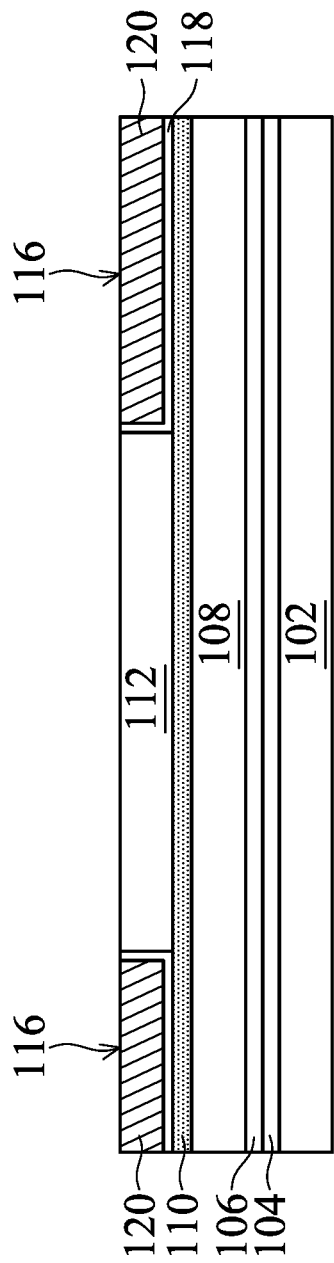
Figure 1C:
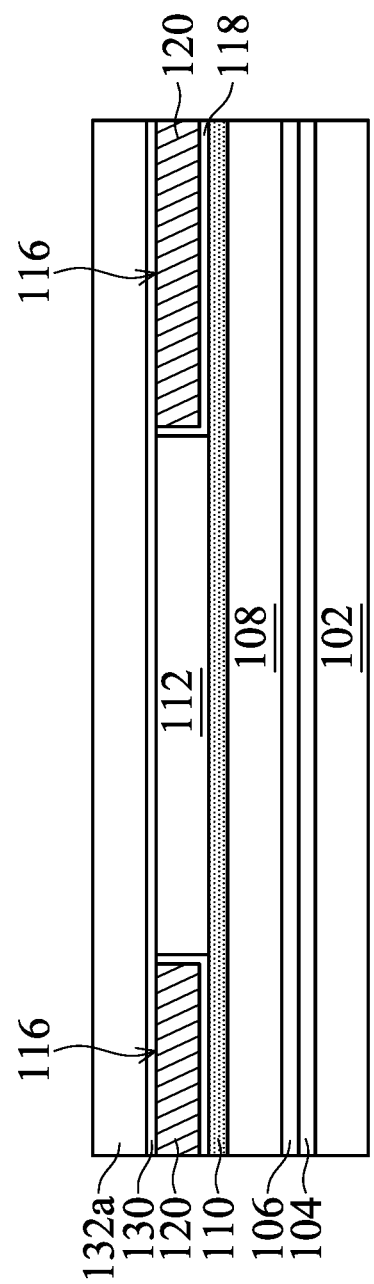
Figure 1D:
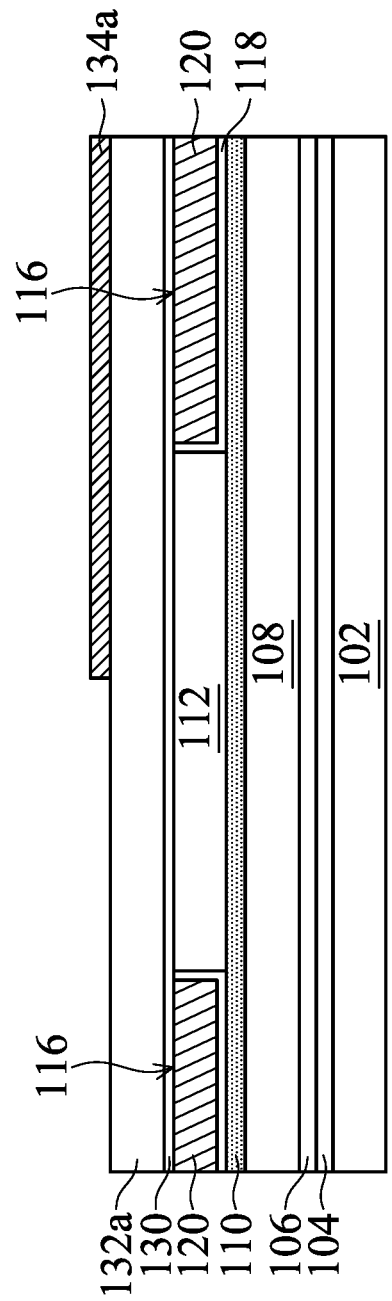
Figure 1E:
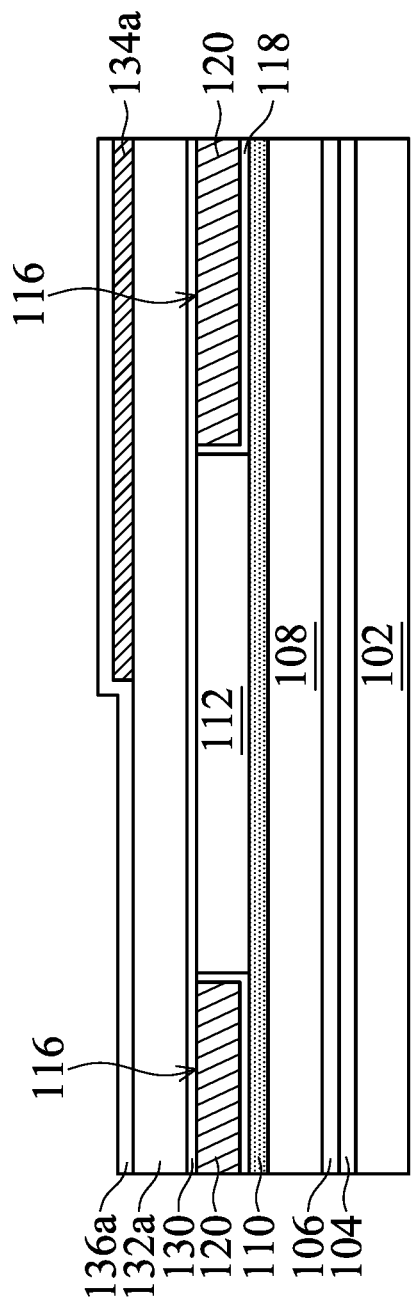
Figure 1F:
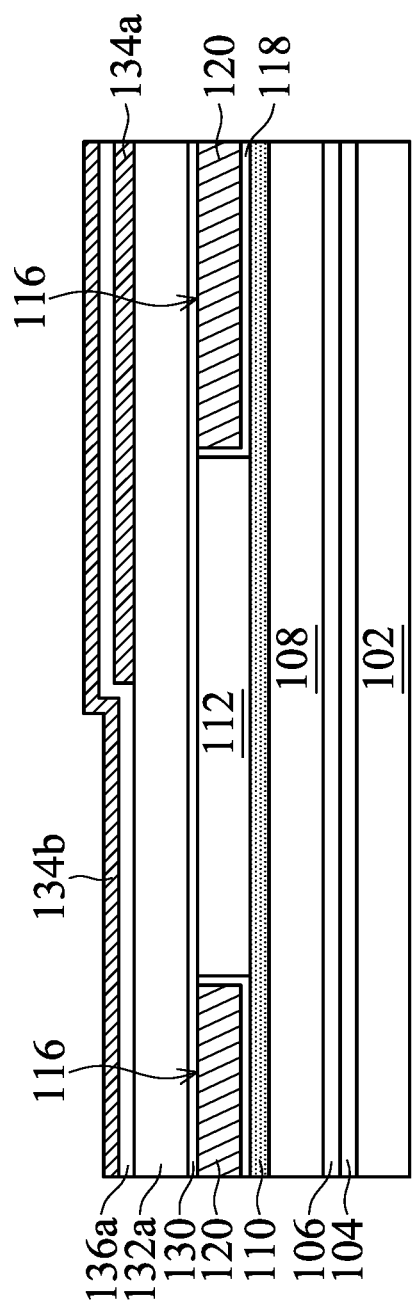
Figure 1G:
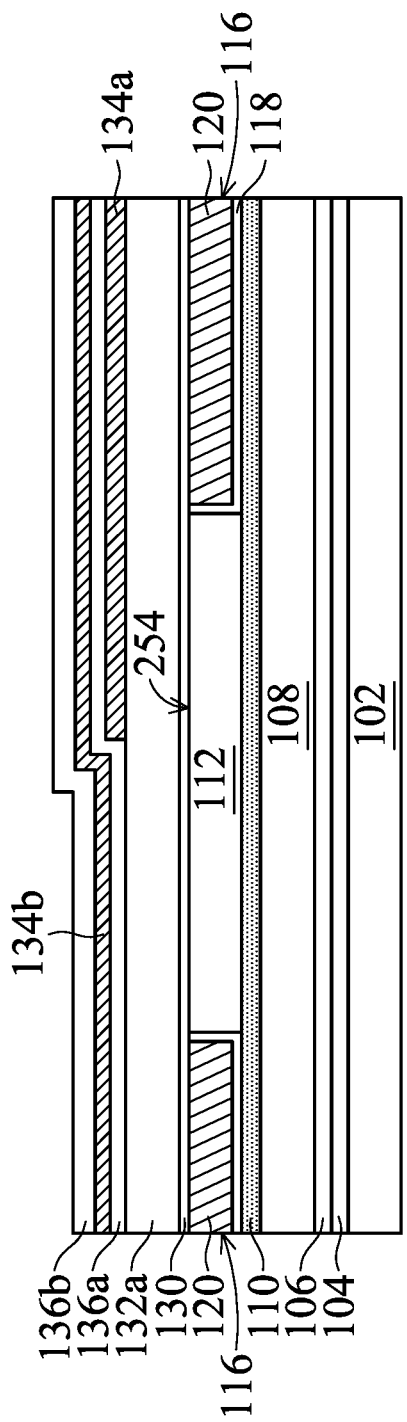
Figure 1H:
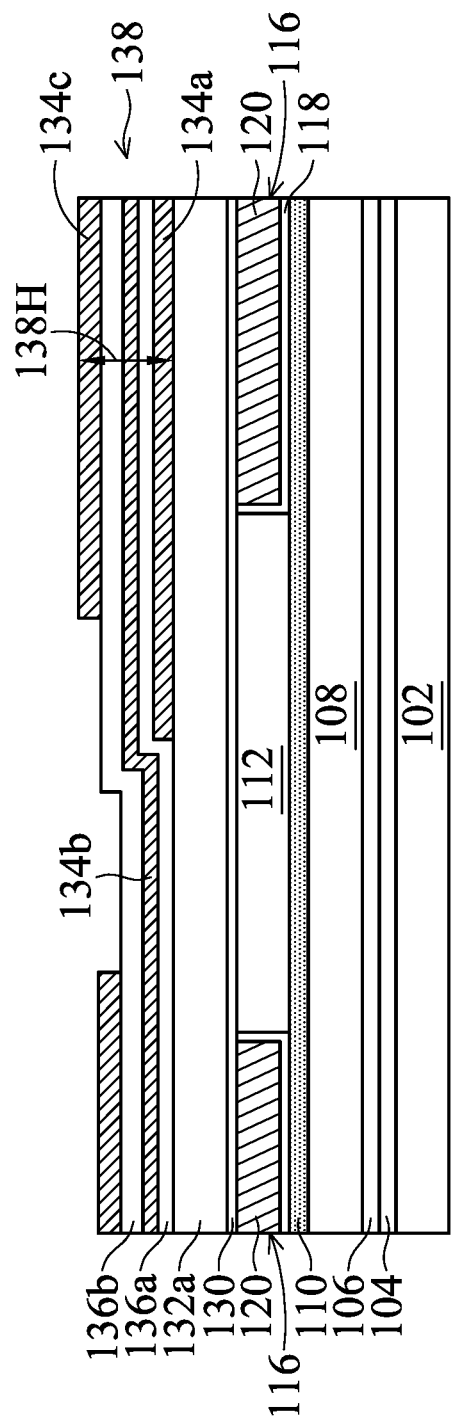
Figure 1I:
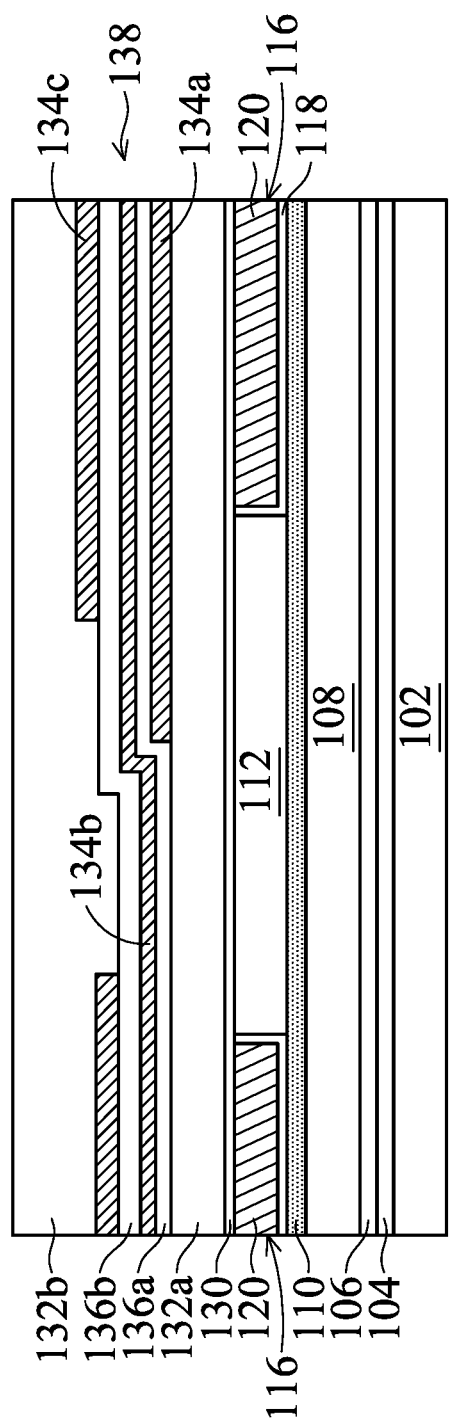
Figure 1J:
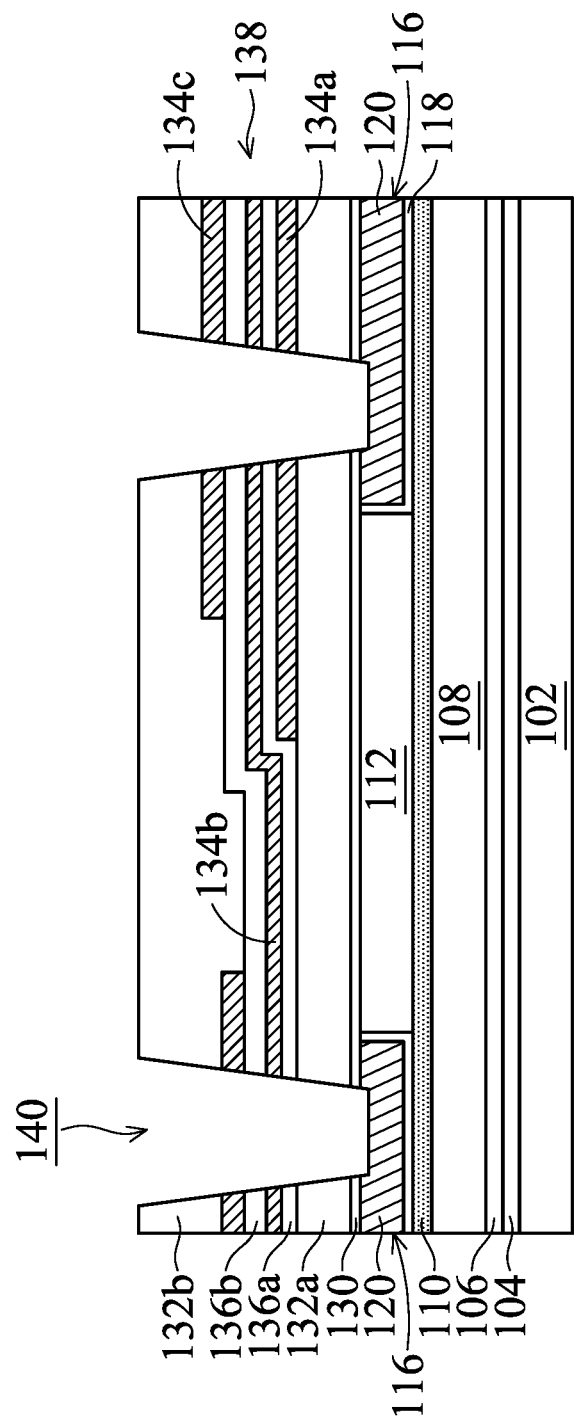
Figure 1K:
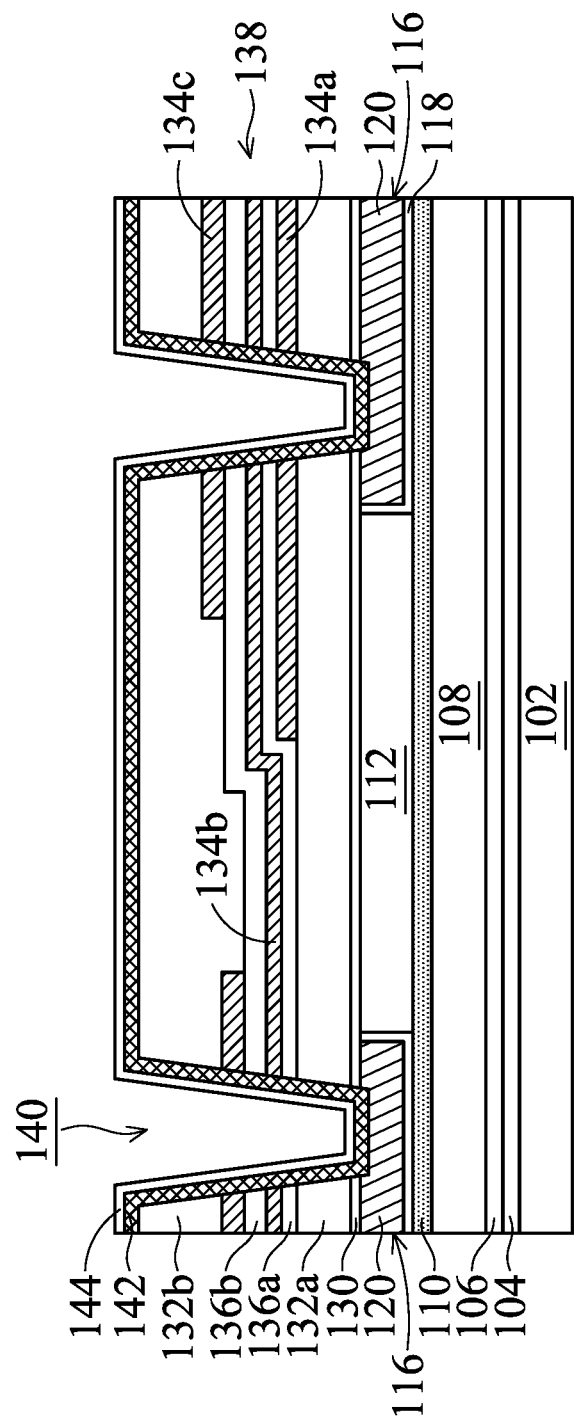
Figure 1L:
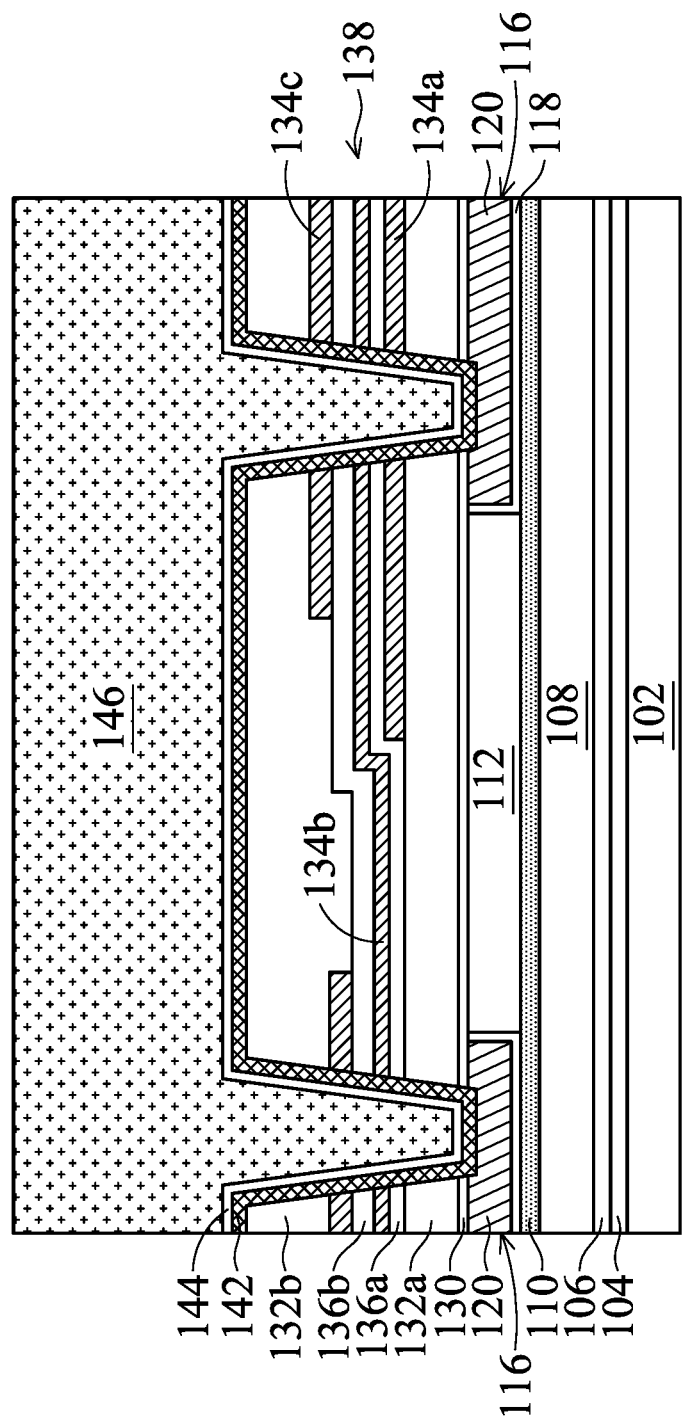
Figure 1M:
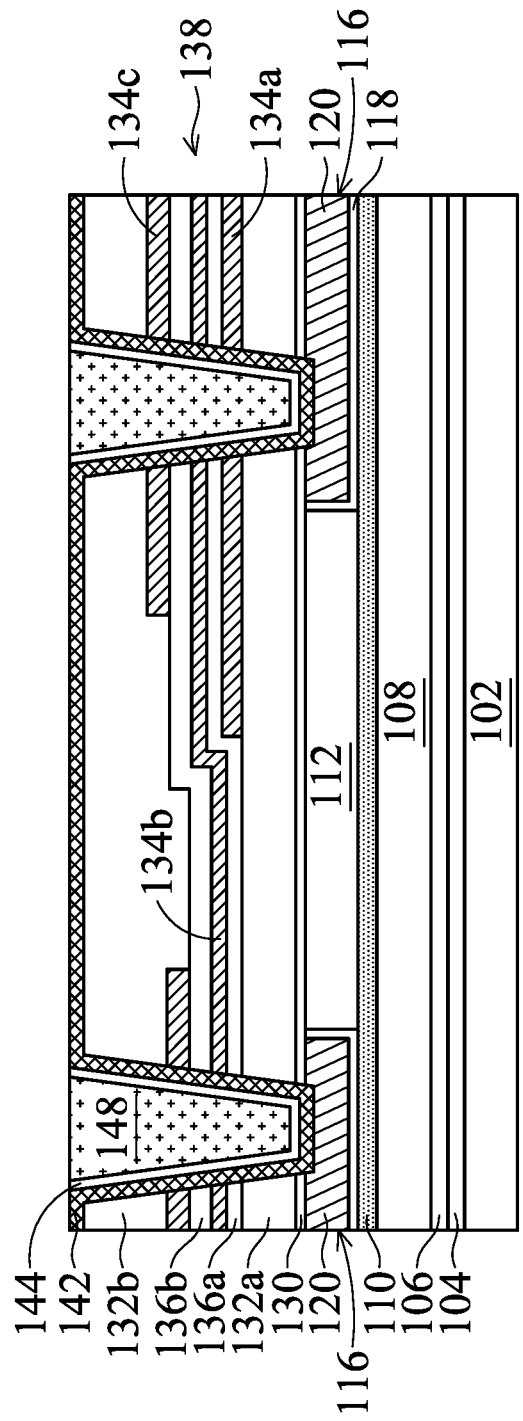
Figure 1N:
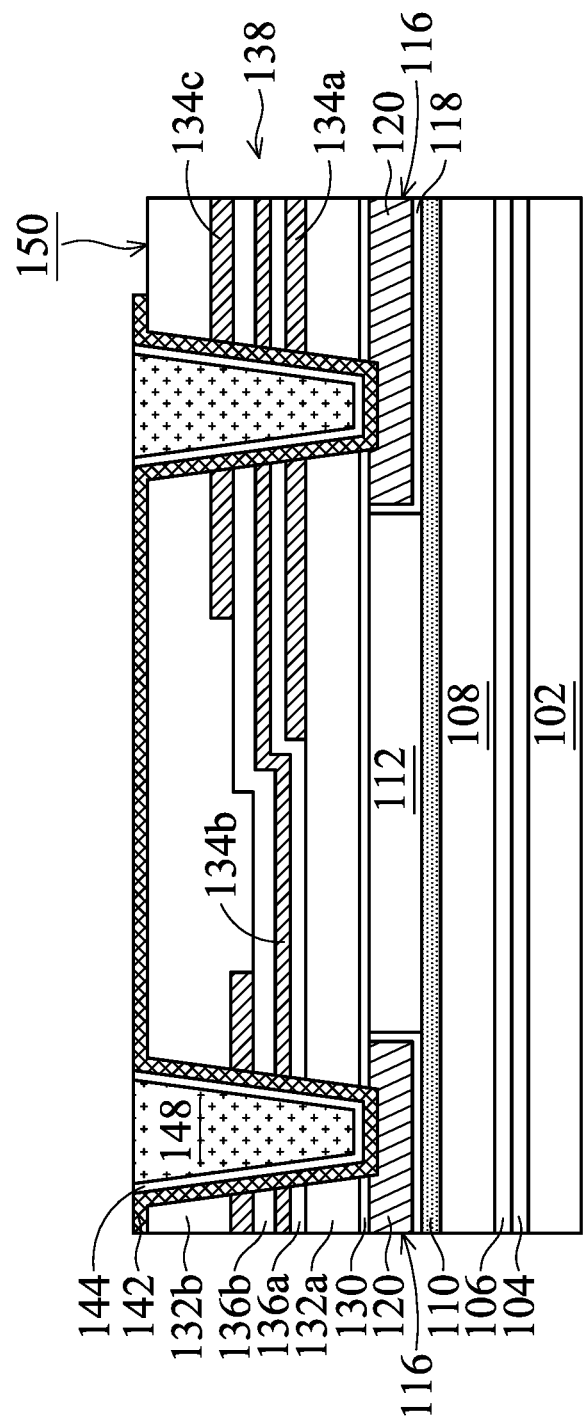
Figure 1O:
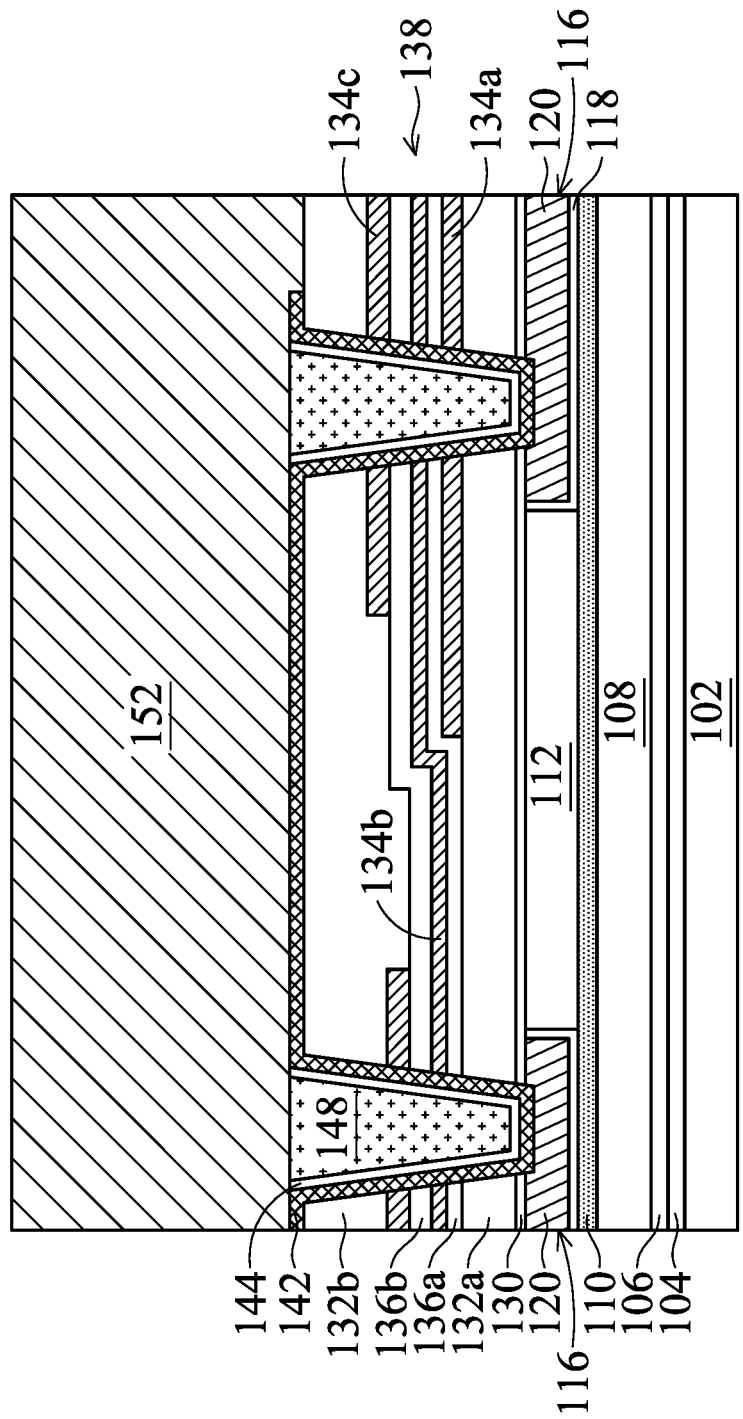
Figure 1P:
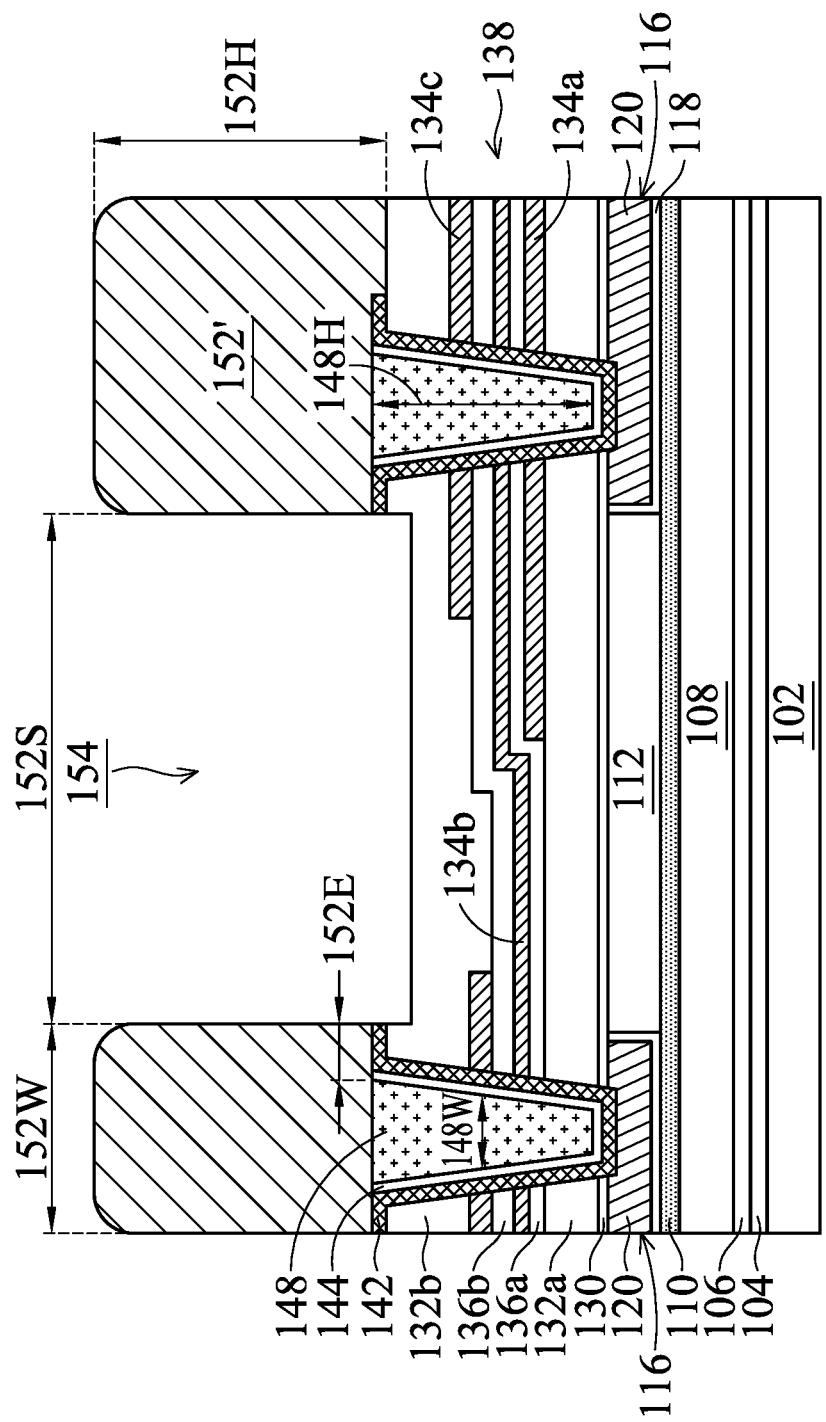
Figure 1Q:
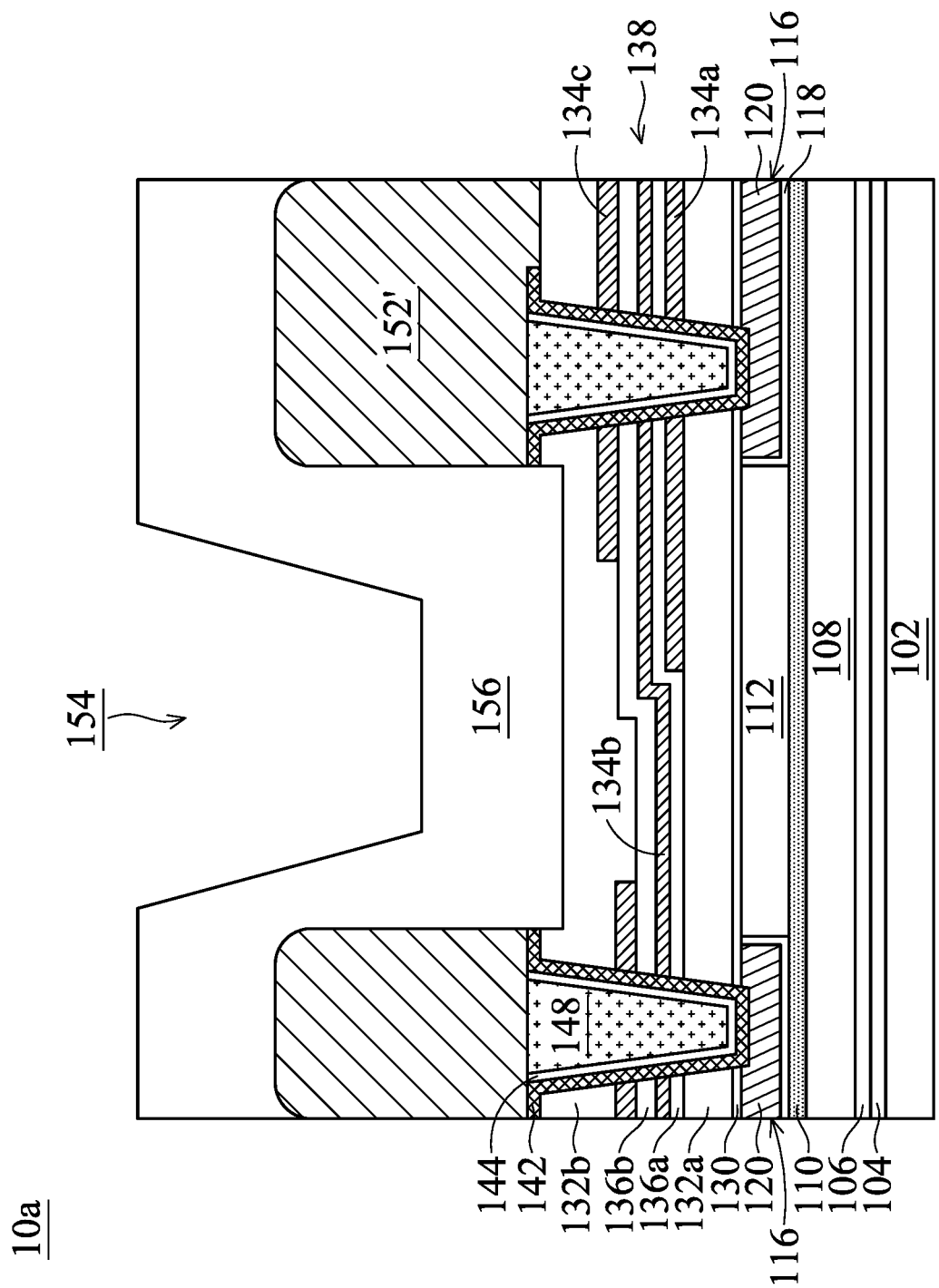
Figures 1, 6:
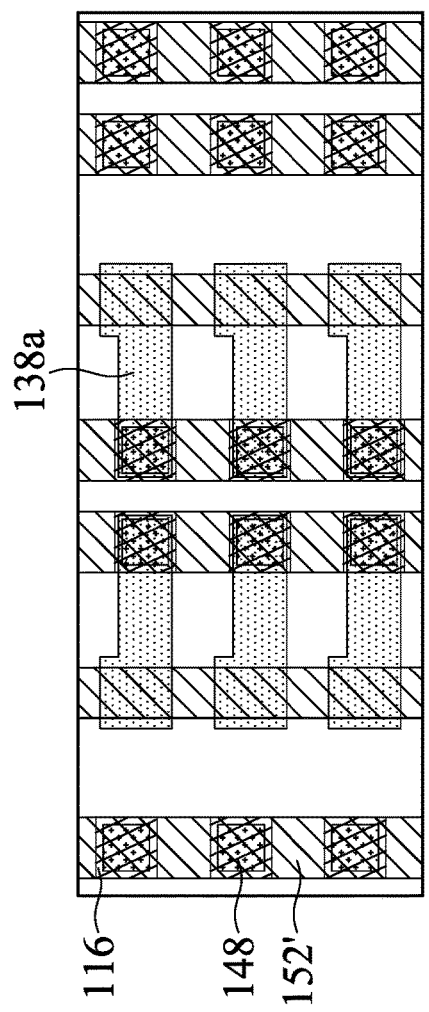
Figures 2, 6:
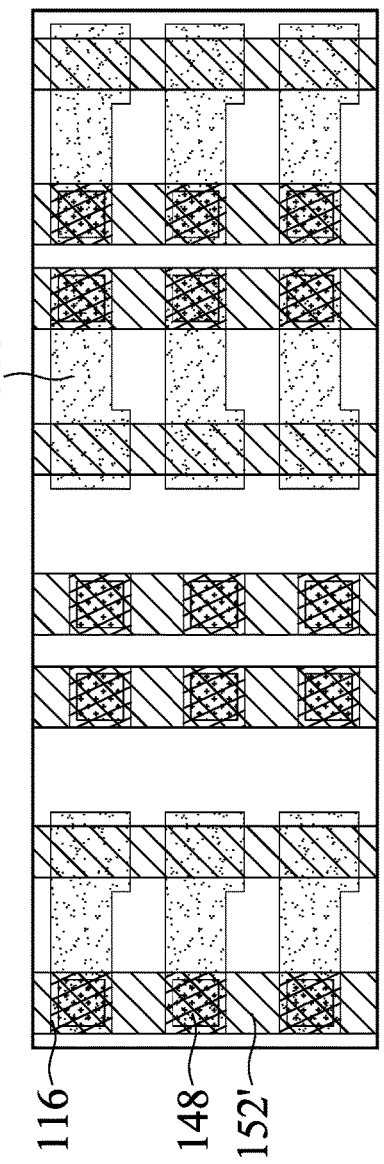

FIGS. 1A-1Q are cross-sectional representations of various stages of forming a semiconductor structure 10a, in accordance with some embodiments of the disclosure. A substrate 102 is provided as shown in FIG. 1 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of elementary semiconductor materials may include, but are not limited to, crystal silicon, polycrystalline silicon, amorphous silicon, germanium, and diamonds. Examples of compound semiconductor materials include, but are not limited to, silicon carbide, gallium nitride, gallium arsenic, gallium phosphide, indium phosphide, indium arsenide, and indium antimonide. Examples of alloy semiconductor materials may include, but are not limited to, SiGe, GaAsP, AlInAs, AlGaAs, GaInAs, GaInP, and GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

The substrate 102 may include active devices and passive devices such as p-type field effect transistors (PFETs), n-type field effect transistors (NFETs), metal-oxide semiconductor field effect transistors (MOSFETs), complementary metal-oxide-semiconductor (CMOS) transistors, bipolar junction transistors (BJTs), laterally diffused MOS (LDMOS) transistors, high voltage transistors, high frequency transistors, diodes, resistors, capacitors, and inductors. The transistors may be planar transistors, FinFET devices, gate-all-around (GAA) transistors, or other non-planar transistors. The transistors may include gate structures with source/drain structures formed on opposite sides. The transistors may be isolated by shallow trench isolation (STI) structures.

Next, an interconnect structure is formed over the substrate 102. The interconnect structure may include conductive structures formed in dielectric layers. The conductive structures may include contact structures, via structures, metal lines, other conductive features, or a combination thereof. The conductive structures may be made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. The conductive structures may be formed by a chemical vapor deposition process (CVD), a physical vapor deposition process (PVD), (e.g., evaporation or sputter), an atomic layer deposition process (ALD), a plasma enhanced CVD (PECVD), a plasma enhanced physical vapor deposition (PEPVD), an electroplating process, another suitable process, or a combination thereof.

The dielectric layers may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, un-doped silicate glass (USG), phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layers may be formed by chemical vapor deposition (CVD), physical vapor deposition (PVD), atomic layer deposition (ALD), spin-on coating, or other applicable processes.

Next, an inter-layer dielectric (ILD) layer 104 is formed over the substrate 102, as shown in FIG. 1A in accordance with some embodiments. The ILD layer 104 may include dielectric materials such as silicon oxide, silicon oxycarbide, silicon oxycarbonitride, silicon nitride, silicon oxynitride, USG, PSG, BPSG, FSG, carbon doped silicon oxide, amorphous fluorinated carbon, parylene, BCB, polyimide, or other applicable dielectric materials. The ILD layer 104 may be formed by CVD, PVD, ALD, spin-on coating, or other applicable processes.

Next, a dielectric layer 106 is formed over the ILD layer 104, as shown in FIG. 1A in accordance with some embodiments. The dielectric layer 106 may include silicon carbide (SiC), other carbide materials, or a combination thereof. The dielectric layer 106 may be formed by CVD, PVD, ALD, other applicable processes, or a combination thereof.

Next, a dielectric layer 108 is formed over the dielectric layer 106, as shown in FIG. 1A in accordance with some embodiments. The dielectric layer 108 may include silicon oxide or USG. The dielectric layer 108 may be formed by CVD such as plasma enhanced CVD (PECVD), high-density plasma CVD (HDP-CVD), sub-atmospheric CVD (SACVD), ALD, PVD, other applicable processes, or a combination thereof.

Next, a dielectric layer 110 is formed over the dielectric layer 108, as shown in FIG. 1A in accordance with some embodiments. The dielectric layer 110 may include nitrogen or carbon containing material such as silicon carbon nitride (SiCN), silicon oxycarbide (SiOC), silicon carbide (SiC), silicon oxycarbonitride (SiOCN), silicon nitride (SiN), other applicable materials, or a combination thereof. The dielectric layer 110 may be formed by CVD, PVD, ALD, other applicable processes, or a combination thereof. The dielectric layer 110 may be an etch stop layer.

Next, a dielectric layer 112 is formed over the dielectric layer 110, as shown in FIG. 1A in accordance with some embodiments. The dielectric layer 112 may include silicon oxide or USG. The dielectric layer 112 may be formed by CVD such as plasma enhanced CVD (PECVD), high-density plasma CVD (HDP-CVD), sub-atmospheric CVD (SACVD), ALD, PVD, other applicable processes, or a combination thereof.

Next, a hard mask layer 114 is formed over the dielectric layer 112, as shown in FIG. 1A in accordance with some embodiments. The hard mask layer 114 may include nitrogen or carbon containing material such as silicon carbon nitride (SiCN), silicon oxycarbide (SiOC), silicon carbide (SiC), silicon oxycarbonitride (SiOCN), silicon nitride (SiN), other applicable materials, or a combination thereof. The hard mask layer 114 may be formed by CVD, PVD, ALD, other applicable processes, or a combination thereof.

Next, the hard mask layer 114 and the dielectric layer 112 are patterned to form trenches in the dielectric layer 112 (not shown). The hard mask layer 114 and the dielectric layer 112 may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. Afterwards, a planarization process such as a chemical mechanical polishing (CMP) process may be performed and the patterned hard mask layer 114 may be removed and the dielectric layer 112 may be exposed.

Afterwards, top metal layer 116 including a barrier layer 118 and a conductive material 120 are formed in the dielectric layer 112, as shown in FIG. 1B in accordance with some embodiments. The barrier layer 118 may be conformally formed over the bottom surface and the sidewalls of the trenches in the dielectric layer 112. Afterwards, the barrier layer 118 may be etched back. The barrier layer 118 remains over the bottom surface and the sidewalls of the trenches. The barrier layer 118 may be formed before filling the conductive material in the trenches to prevent the conductive material from diffusing out. The barrier layer 118 may also serve as an adhesive or glue layer. The material of the barrier layer 118 may be tantalum, titanium, titanium nitride, other applicable materials, or a combination thereof. The barrier layer 118 may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a conductive material 120 of the top metal layer 116 is formed into the trenches. The conductive material 120 of the top metal layer 116 may be made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The conductive material 120 of the top metal layer 116 may be formed by a chemical vapor deposition process (CVD) such as a plasma enhanced CVD (PECVD) or a plasma enhanced physical vapor deposition (PEPVD), a physical vapor deposition process (PVD), (e.g., evaporation or sputter), an atomic layer deposition process (ALD), an electroplating process, another suitable process, or a combination thereof to deposit the conductive material 120 of the top metal layer 116, and then a planarization process such as a chemical mechanical polishing (CMP) process or an etch back process is optionally performed to remove excess conductive materials. After the planarization process, the top surface of the top metal layer 116 may be level with the top surfaces of the dielectric layer 112. The top metal layer 116 may be referred to as contact structures 116.

Next, an etch stop layer 130 is formed over the dielectric layer 112, as shown in FIG. 1C in accordance with some embodiments. The etch stop layer 130 may include nitrogen or carbon containing material such as silicon carbon nitride (SiCN), silicon oxycarbide (SiOC), silicon carbide (SiC), silicon oxycarbonitride (SiOCN), silicon nitride (SiN), other applicable materials, or a combination thereof. The etch stop layer 130 may be formed by CVD, PVD, ALD, other applicable processes, or a combination thereof.

Next, a first passivation layer 132a is formed over the etch stop layer 130, as shown in FIG. 1C in accordance with some embodiments. The etch stop layer 130 may be formed between the top metal layer 116 and the first passivation layer 132a. The first passivation layer 132a may include silicon nitride, silicon oxide, or USG. The first passivation layer 132a may be formed by CVD such as plasma enhanced CVD (PECVD), high-density plasma CVD (HDP-CVD), sub-atmospheric CVD (SACVD), ALD, PVD, other applicable processes, or a combination thereof. The first passivation layer 132a may be plasma-enhanced oxide (PEOX).

In some embodiments, the first passivation layer 132a has a thickness in a range of about 500 Å to about 10000 Å. If the first passivation layer 132a is too thick, it may be difficult to form a via structure through the first passivation layer 132a in the following process. If the first passivation layer 132a is too thin, the MIM structure 138 formed over the first passivation layer 132a may be delaminated or crack after forming the bump structure.

Next, a metal-insulator-metal (MIM) structure 138 is formed over the first passivation layer 132a, as shown in FIGS. 1D-1H in accordance with some embodiments. The MIM structure 138 may include a bottom conductor plate layer, a middle conductor plate layer, a top conductor plate, and insulating layers formed between them.

A bottom conductor plate layer 134a is formed over the first passivation layer 132a, as shown in FIG. 1D in accordance with some embodiments. The bottom conductor plate layer 134a may be formed by a deposition and patterning process. The bottom conductor plate layer 134a may include TiN, TaN, WN, Ru, Ti, Ta, W, Mo, Re, Nb, other applicable materials, an alloy thereof, or a combination thereof. The deposition process may include formed by CVD such as plasma enhanced CVD (PECVD), high-density plasma CVD (HDP-CVD), sub-atmospheric CVD (SACVD), ALD, PVD (e.g., evaporation or sputter), an electroplating process, another suitable process, or a combination thereof. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. In some embodiments, the patterned bottom conductor plate layer 134a covers a portion of the first passivation layer 132a.

Next, an bottom insulating layer 136a is formed over the first passivation layer 132a and the bottom conductor plate layer 134a, as shown in FIG. 1E in accordance with some embodiments. In some embodiments, the bottom insulating layer 136a is conformally formed over the first passivation layer 132a and the bottom conductor plate layer 134a. The bottom insulating layer 136a may be in direct contact with the first passivation layer 132a and the bottom conductor plate layer 134a. The bottom insulating layer 136a may include high-k dielectrics such as $HfO_2$, $ZrO_2$, $TiO_2$, other applicable materials, or a combination thereof. The bottom insulating layer 136a may be formed by CVD, PVD, ALD, other applicable processes, or a combination thereof.

Next, a middle conductor plate layer 134b is formed over the bottom insulating layer 136a, as shown in FIG. 1F in accordance with some embodiments. The middle conductor plate layer 134b may be conformally formed over the bottom insulating layer 136a. The middle conductor plate layer 134b may include TiN, TaN, WN, Ru, Ti, Ta, W, Mo, Re, Nb, other applicable materials, an alloy thereof, or a combination thereof. The deposition process may include formed by CVD such as PECVD, HDP-CVD, SACVD, ALD, PVD (e.g., evaporation or sputter), an electroplating process, another suitable process, or a combination thereof.

Next, a top insulating layer 136b is formed over the middle conductor plate layer 134b, as shown in FIG. 1G in accordance with some embodiments. The middle conductor plate layer 134b may be conformally formed over the bottom insulating layer 136a. The top insulating layer 136b may include high-k dielectrics such as $HfO_2$, $ZrO_2$, $TiO_2$, other applicable materials, or a combination thereof. The top insulating layer 136b may be formed by CVD, PVD, ALD, other applicable processes, or a combination thereof.

Afterwards, a top conductor plate layer 134c is formed over the top insulating layer 136b, as shown in FIG. 1H in accordance with some embodiments. The top conductor plate layer 134c may be formed by a deposition and patterning process. The top conductor plate layer 134c may include TiN, TaN, WN, Ru, Ti, Ta, W, Mo, Re, Nb, other applicable materials, an alloy thereof, or a combination thereof. The deposition process may include formed by CVD such as PECVD, HDP-CVD, SACVD, ALD, PVD (e.g., evaporation or sputter), an electroplating process, another suitable process, or a combination thereof. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. In some embodiments, the patterned top conductor plate layer 134c covers a portion of the top insulating layer 136b, and a portion of the top insulating layer 136b is exposed.

In some embodiments, each of the conductor plate layers 134a/134b/134c has a thickness of about 0.1 nm to about 1000 nm. If the conductor plate layer 134a/134b/134c is too thick, it may be difficult to form a via structure through the MIM structure 138 in the following process. If the first passivation layer 132b is too thin, the MIM structure 138 may be delaminated or crack after forming the bump structure over the MIM structure 138.

In some embodiments, each of the insulating layers 136a/136b has a thickness of about 0.1 nm to about 1000 nm. If the insulating layer 136a/136b is too thick, it may be difficult to form a via structure through the MIM structure 138 in the following process. If the insulating layer 136a/136b is too thin, the MIM structure 138 may be delaminated or crack after forming the bump structure over the MIM structure 138.

In some embodiments, the MIM structure 138 has a thickness 138H in a range of about 500 Å to about 3000 Å. The thickness 138H of the MIM structure 138 depends on the layer numbers of the conductor plate layers and the insulating layers, which depends on the demand of design.

It should be noted that, the MIM structure 138 includes three conductor plate layers 134a/134b/134c and two insulating layers 136a/136b as shown in FIG. 1H, the present disclosure is not limited thereto. There may be more than two conductor plate layers and the layer number of the insulating layers is one layer less than the conductor plate layers, depending on the demand of design.

Next, a first passivation layer 132b is formed over the top insulating layer 136b, as shown in FIG. 1I in accordance with some embodiments. The first passivation layer 132b may include silicon nitride, silicon oxide, or USG. The first passivation layer 132b may be formed by CVD such as plasma enhanced CVD (PECVD), high-density plasma CVD (HDP-CVD), sub-atmospheric CVD (SACVD), ALD, PVD, other applicable processes, or a combination thereof. The first passivation layer 132b may be plasma-enhanced oxide (PEOX).

In some embodiments, the first passivation layer 132b has a thickness in a range of about 500 Å to about 30000 Å. If the first passivation layer 132b is too thick, it may be difficult to form a via structure through the first passivation layer 132b in the following process. If the first passivation layer 132b is too thin, the MIM structure 138 formed under the first passivation layer 132b may be delaminated or crack after forming the bump structure.

Next, an opening 140 is formed through the MIM structure 138 and the etch stop layer 130, and stops at the top metal layer 116, as shown in FIG. 1J in accordance with some embodiments. The opening 140 may be formed by a patterning and an etching process using a patterned photoresist layer as a mask (not shown). A portion of the top metal layer 116 may be exposed from the opening 140. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process.

Next, a barrier layer 142 is formed in the opening 140 and over the first passivation layer 132b, as shown in FIG. 1K in accordance with some embodiments. The barrier layer 142 may be conformally formed over the bottom surface and the sidewalls of the opening 140 and over the top surface of the first passivation layers 132b. The barrier layer 142 may be formed before filling the conductive material in the opening 140 to prevent the conductive material from diffusing out. The barrier layer 142 may also serve as an adhesive or glue layer. The material of the barrier layer 142 may be Ti, Ta, TiN, TaN, W, WTi, other applicable materials, or a combination thereof. The barrier layer 142 may be formed by depositing the barrier layer materials by a physical vapor deposition process (PVD) (e.g., evaporation or sputtering), an atomic layer deposition process (ALD), an electroplating process, other applicable processes, or a combination thereof.

In some embodiments, the barrier layer 142 has a thickness in a range of about 100 Å to about 1000 Å. If the barrier layer 142 is too thick, the resistance may be increased. If the barrier layer 142 is too thin, the subsequently formed via material may be diffused out.

Next, a seed layer 144 is formed over the barrier layer 142, as shown in FIG. 1K in accordance with some embodiments. The seed layer 144 may be used in the following electroplating process. The material of the seed layer 144 may be Al, AlCu, Cu, Au, W, Fe. Ti. Ta, Co, Sn, Ge, other applicable materials, or a combination thereof. In some embodiment, the barrier layer 142 and the seed layer 144 are made of different materials. The seed layer 144 may be formed by depositing the barrier layer materials by a physical vapor deposition process (PVD) (e.g., evaporation or sputtering), an atomic layer deposition process (ALD), an electroplating process, other applicable processes, or a combination thereof.

In some embodiments, the seed layer 144 has a thickness in a range of about 100 Å to about 3000 Å. If the seed layer 144 is too thick, the resistance may be increased. If the seed layer 144 is too thin, the subsequently formed via material may not be formed well.

Afterwards, a via material 146 is formed in the opening 140 and over the first passivation layer 132b, as shown in FIG. 1L in accordance with some embodiments. The via material 146 may include Al, AlCu, Cu, Au, W, Fe, Ti, Ta, Co, Sn, Ge, other applicable materials, or a combination thereof. The via material 146 may be formed by an electroplating process, other applicable processes, or a combination thereof. In some embodiment, the via material 146 is formed by an electro-chemical plating (ECP) process. The top surface of the via material 146 is substantially flat after the deposition process.

Afterwards, a planarization process is performed and a via structure 148 is formed in the opening 140, as shown in FIG. 1M in accordance with some embodiments. The excess via material 146 and the seed layer 144 over the top surface of the first passivation layer 132b are removed when planarizing the via material 146. Removing the seed layer 144 over the first passivation layer 132b may reduce the resistance. The planarization process such as a chemical mechanical polishing (CMP) process or an etch back process is optionally performed to remove excess via material 146 and the seed layer 144. After the planarization process, the top surface of the via structure 148 is substantially level with the top surface of the barrier layer 142. In addition, the barrier layer 142 is exposed after the planarization process. In some embodiments, the seed layer 144 is formed over sidewalls and the bottom surface of the via structure 148.

Next, a portion of the barrier layer 142 over the top surface of the first passivation layer 132*b* is removed and an opening 150 is formed in the barrier layer 142, as shown in FIG. 1N in accordance with some embodiments. A portion of the top surface of the first passivation layer 132*b* is exposed in the opening 150. Removing a portion of the seed layer 144 over the first passivation layer 132*b* may further reduce the resistance. The opening 150 may be formed by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process.

Afterwards, a redistribution layer (RDL) material 152 is deposited over the via structure 148 and the first passivation layer 132*b* and in the opening 150, as shown in FIG. 1O in accordance with some embodiments. The RDL material 152 may include Al, AlCu, Cu, Au, W, Fe, Ti, Ta, Co, Sn, Ge, other applicable materials, or a combination thereof. The RDL material 152 and the via material 146 may be the same or may be different, depends on the process demands. The RDL material 152 may be formed CVD, PVD, electroplating such as an electro-chemical plating (ECP), other applicable processes, or a combination thereof.

In some embodiments, the RDL material 152 filled in the opening 150 is in direct contact with the first passivation layer 132*b*. In some embodiments, the RDL material 152 is in direct contact with the top surfaces of the barrier layer 142 and the seed layer 144.

Next, the RDL material 152 is patterned and RDL structures 152' are formed, as shown in FIG. 1P in accordance with some embodiments. In some embodiments, an opening 154 is formed in the RDL material 152. In some embodiments, the opening 154 is formed through the RDL material 152, the barrier layer 142, and stops in the first passivation layer 132*b*. The first passivation layer 132*b* may be recessed when patterning the RDL material 152. The opening 154 may be formed by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. The etching process may be stopped by controlling the etching time.

In some embodiments, the RDL structure 152' has a substantially flat top surface with rounded corners. In some embodiments, at least a portion of the top surface the RDL structure 152' is flat. In some embodiments, the top corners of the RDL structure 152' are rounded when forming the RDL structure 152'. When the RDL structure 152' has rounded top corners, the stress may be released.

In some embodiments, the RDL structure 152' has a height 152H in a range of about 1 μm to about 10 μm. If the RDL structure 152' is too high, it may be difficult for subsequently formed passivation layer to fill in the opening 154. If the RDL structure 152' is too low, the resistance may be increased.

In some embodiments, the RDL structure 152' has a width 152W in a range of about 1 μm to about 10 μm. If the RDL structure 152' is too narrow, the current allowed to flow in the RDL structure 152' may be not enough.

In some embodiments, the space 152S between adjacent RDL structures 152' is in a range of about 1 μm to about 10 μm. If the space 152S between adjacent RDL structures 152' is too narrow, it may be difficult for subsequently formed passivation layer to fill in the opening 154, or the subsequently formed passivation layer may be too thick and the stress may be increased.

In some embodiments, the RDL structure 152', the barrier layer 142, and the first passivation layer 132*b* are exposed in the opening 154. In some embodiments, the top surface of the first passivation layer 132*b* under the opening 154 is lower than the bottom surface of the RDL structure 152'.

In some embodiments, the via structure 148 has a width 148W at the middle height of the via structure 148. In some embodiments, the width 148W of the via structure 148 is in a range of about 1 μm to about 10 μm. If the via structure 148 is too wide, it may be difficult for subsequently formed passivation layer to fill in the opening 154, or the subsequently formed passivation layer may be too thick and the stress may be increased.

In some embodiments, the via structure 148 has a height 148H. In some embodiments, the width 148H of the via structure 148 is in a range of about 0.5 μm to about 5 μm. If the via structure 148 is too high, the subsequently formed passivation layer to fill in the opening 154 may be too thick, and the induced higher stress may cause wafer warpage. The lowest height of the via structure 148 may be limited by the thickness of the first passivation layers 132*a* and 132*b* and the MIM structure 138.

In some embodiments, the RDL structure 152' extends from a sidewall of the via structure 148 at a distance 152E in a range of about 0.1 μm to about 10 μm. If the distance 152E is too great, it may be difficult for subsequently formed passivation layer to fill in the opening 154, or the subsequently formed passivation layer may be too thick and the stress may be increased. If the distance 152E is too less, the RDL structure 152' may be worse. In some embodiments, the barrier layer 142 extends over a portion of the first passivation layers 132*b*.

Next, a second passivation layer 156 is conformally formed over the RDL structure 152' and the first passivation layer 132*b* in the opening 154, as shown in FIG. 1Q in accordance with some embodiments. The second passivation layer 156 may include silicon nitride, silicon oxide, or USG. The second passivation layer 156 may be formed by CVD such as plasma enhanced CVD (PECVD), high-density plasma CVD (HDP-CVD), sub-atmospheric CVD (SACVD), ALD, PVD, other applicable processes, or a combination thereof. The second passivation layer 156 may be plasma-enhanced oxide (PEOX). In some embodiments, the bottom surface of the second passivation layer 156 is lower than the bottom surface of the RDL structure 152".

The second passivation layer 156 may be a multi-layer structure made of different materials. In some embodiments, the second passivation layer 156 and the first passivation layers 132*a* and 132*b* are made of the same material.

In some embodiments, the second passivation layer 156 has a thickness of about 5000 Å to about 50000 Å. If the second passivation layer 156 is too thick, it may be difficult to be filled in the opening 154, the stress may be increased. The MIM structure 138 may be damaged, and the capacitance of the MIM structure 138 may be decreased.

By forming the via structure 148 and the RDL structure 152' separately, The RDL structure 152' may have a flat top surface, and the RDL structure 152' may be more robust and there may be no seam formed in the RDL structure 152'. The reliability may be improved. In addition, the first passivation layer 132a and 132b may be thicker by using electrochemical plating (ECP) deposition process forming the via structure material 146. Therefore, the MIM structure 138 may be more robust.

Figure 2:
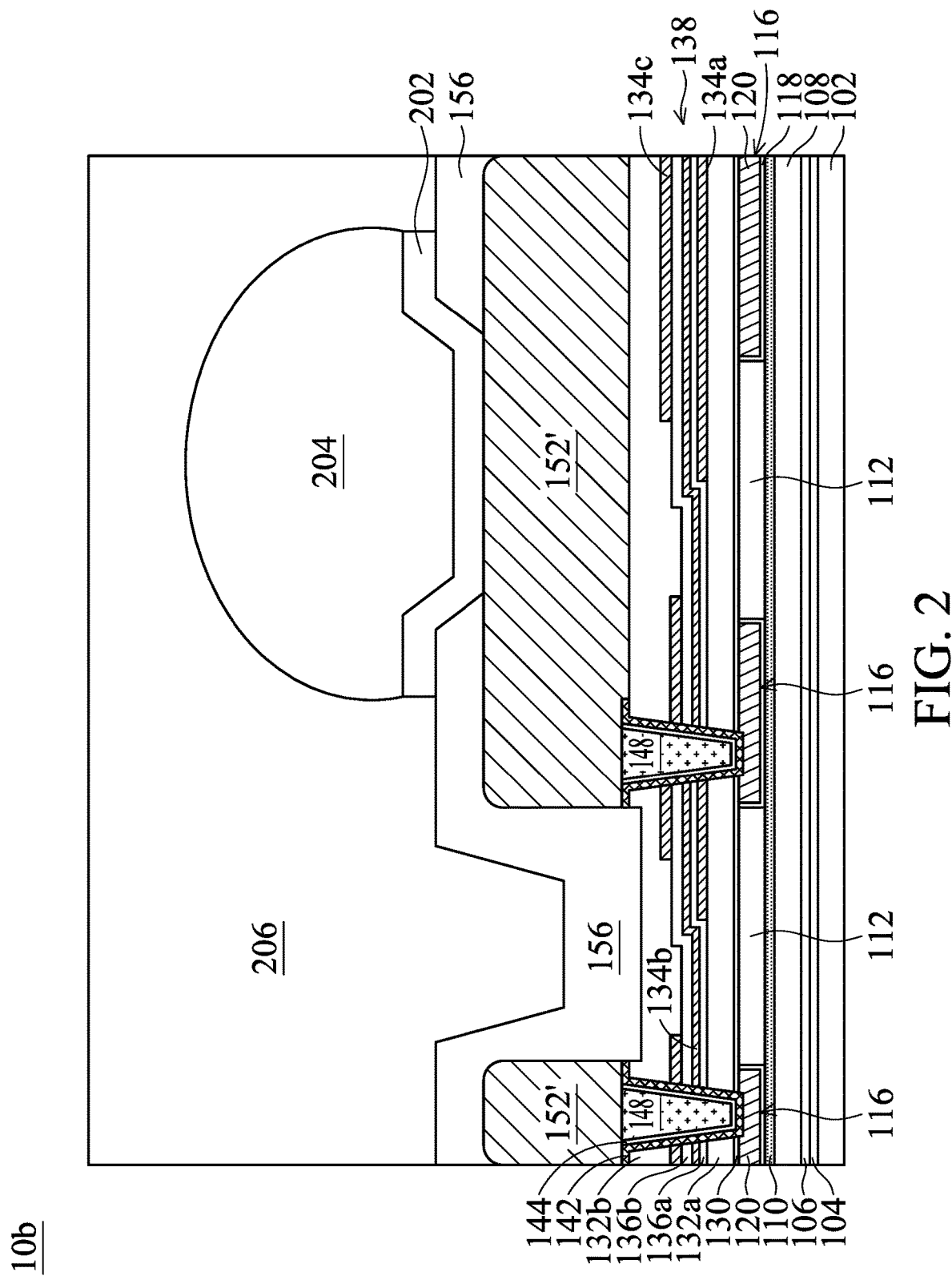
FIG. 2 is a cross-sectional representation of a semiconductor structure, in accordance with some embodiments of the disclosure.

Many variations and/or modifications may be made to the embodiments of the disclosure. FIG. 2 is a cross-sectional representation of a semiconductor structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 2 in accordance with some embodiments, a bump structure 204 is formed over the RDL structure 152'.

After the semiconductor structure 10a as shown in FIG. 1Q is formed, an under bump metallurgy (UBM) 202 may be formed through or over the second passivation layer 156, providing electrical connection between the RDL structure 152' and subsequently formed bump structure. The UBM 202 may have a solderable metal surface to serve as an interface between a solder bump and the RDL structure 152'. The UBM 202 may provide a low resistance electrical connection to the RDL structure 152'. The UBM 202 may be made of metal such as copper, nickel, titanium, tungsten, aluminum, other suitable conductive materials, or a combination thereof. The UBM 202 may be formed by a plating process followed by a patterning process. The plating process may include electroplating or electroless plating, other suitable process, or a combination thereof. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process.

Afterwards, a bump structure 204 is formed over the UBM 202, as shown in FIG. 2 in accordance with some embodiments. The bump structure 204 may include a metal pillar, solder ball, other applicable connectors, or a combination thereof. For example, the bump structure 204 may include a solder ball formed over a metal pillar (not shown). The UBM 202 may be formed between the bump structure 204 and the RDL structure 152' as an interface. The metal pillar may be deposited by electroplating, sputtering, evaporation, or other suitable method. The metal pillar may be made of Cu. The solder ball may be made of a solder material, such as Sn, Ag, Au, or another suitable conductive material. The solder ball may be formed by evaporation, electroplating, solder transfer, other suitable process, or a combination thereof.

Next, a polyimide layer 206 is formed over the second passivation layer 156 and the bump structure 204, as shown in FIG. 2 in accordance with some embodiments. The polyimide layer 206 is filled in the opening 154. The polyimide layer 206 may be formed by a spin-on coating process and a baking process.

Forming the bump structure 204 and the polyimide layer 206 may cause stress on the underlying structure such as the MIM structure 138 or the RDL structure 152'. Thicker first passivation layers 132a and 132b may be needed for more robust MIM structures 138. The thickness of the passivation layers 132a and 132b may not be limited while the via structure 148 and the RDL structure 152' are formed separately. The stress may also be released by rounding the corners of the RDL structure 152".

By forming the via structure 148 and the RDL structure 152' separately, The RDL structure 152' may have a flat top surface, and the RDL structure 152' may be more robust and there may be no seam formed in the RDL structure 152'. The reliability may be improved. In addition, the first passivation layer 132a and 132b may be thicker by using electrochemical plating (ECP) deposition process forming the via structure material 146. Therefore, the MIM structure 138 may be more robust. The stress the MIM structure 138 and the RDL structure 152' suffered may be caused by the following process of forming the bump structure 204 and the polyimide layer 206.

Many variations and/or modifications may be made to the embodiments of the disclosure. FIGS. 3A-3F are cross-sectional representations of various stages of forming a semiconductor structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A in accordance with some embodiments, the via material 146 is conformally formed over the barrier layer 142.

In some embodiments, the via material 146 is conformally formed after the barrier layer 142 is formed. Therefore, a recess 302 may be formed in the via material 146 over the opening 140. In some embodiments, the via material 146 is in direct contact with the barrier layer 142. In some embodiments, the via material 146 is formed by a PVD or a CVD process.

Figure 3A:
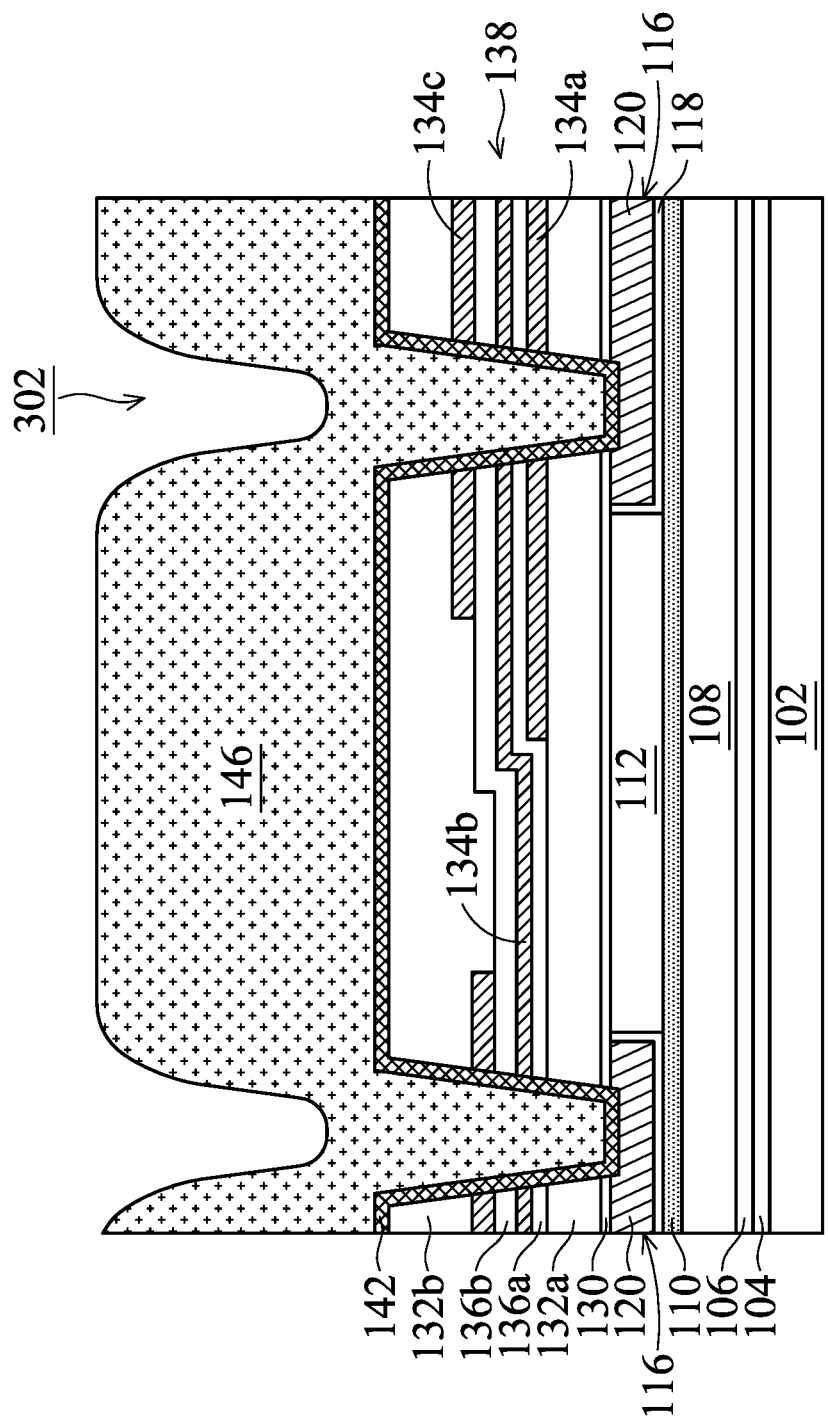
FIGS. 3A-3F are cross-sectional representations of various stages of forming a semiconductor structure, in accordance with some embodiments of the disclosure.
Figure 3B:
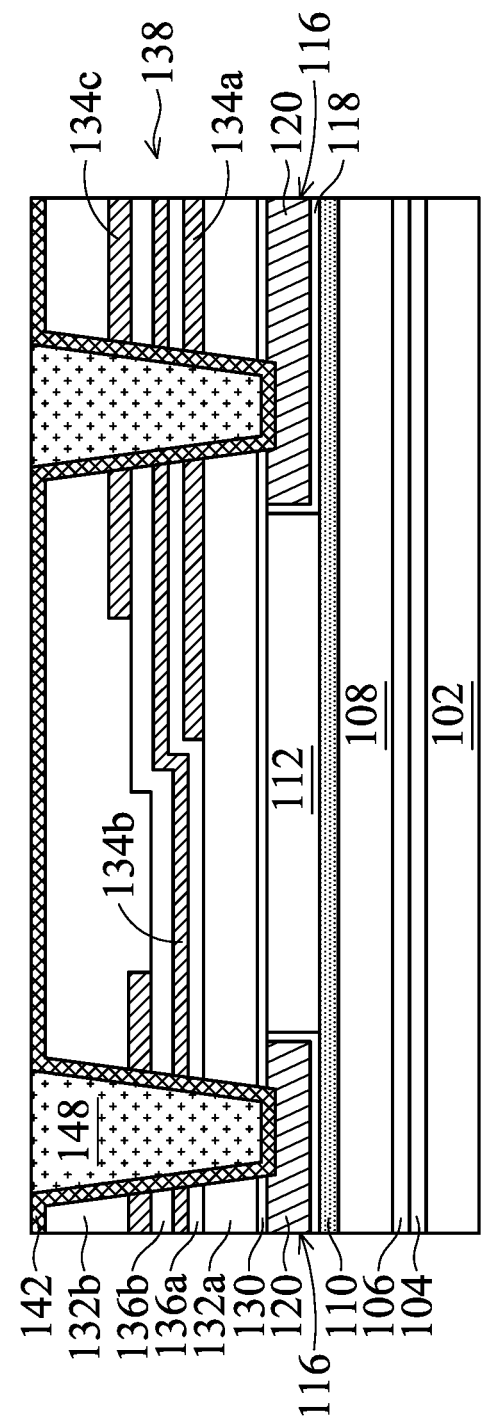

Next, a planarization process is performed and the via structure 148 is formed in the opening 140, as shown in FIG. 3B in accordance with some embodiments. The barrier layer 142 remains and the top surface of the via structure 148 is substantially level with the top surface of the barrier layer 142 after the planarization process. In some embodiments, the via structure 148 has a flat surface after the planarization process. The planarization process such as a chemical mechanical polishing (CMP) process or an etch back process is optionally performed to remove excess conductive materials.

Figure 3C:
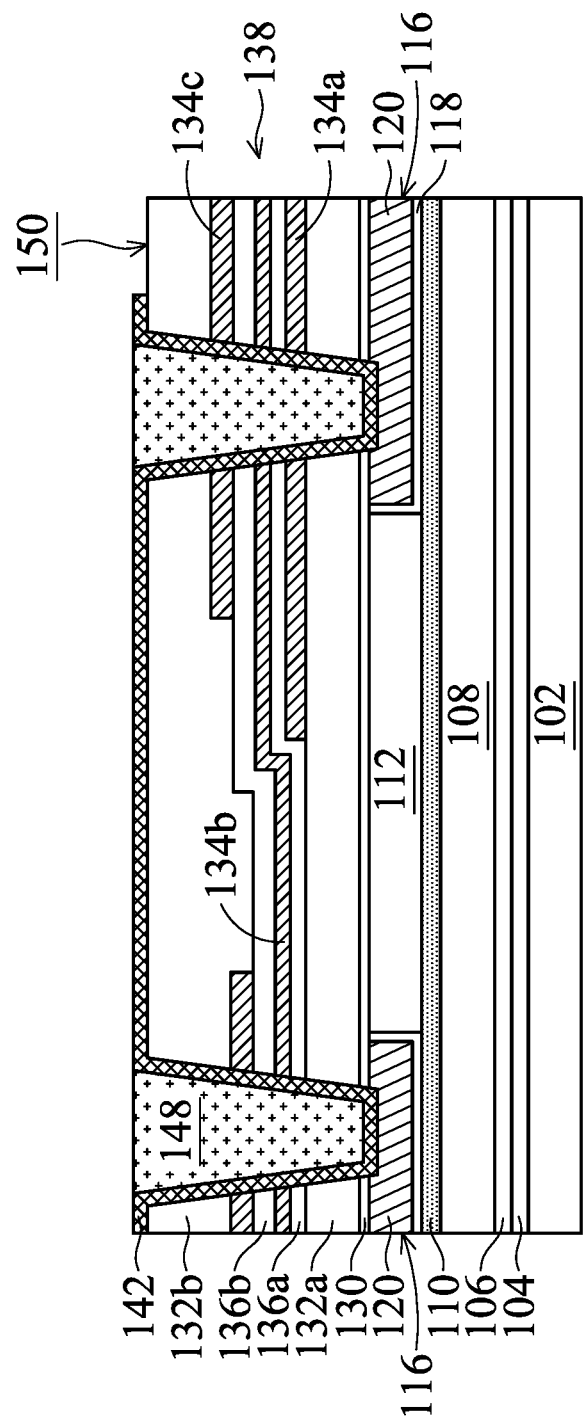
Figure 3D:
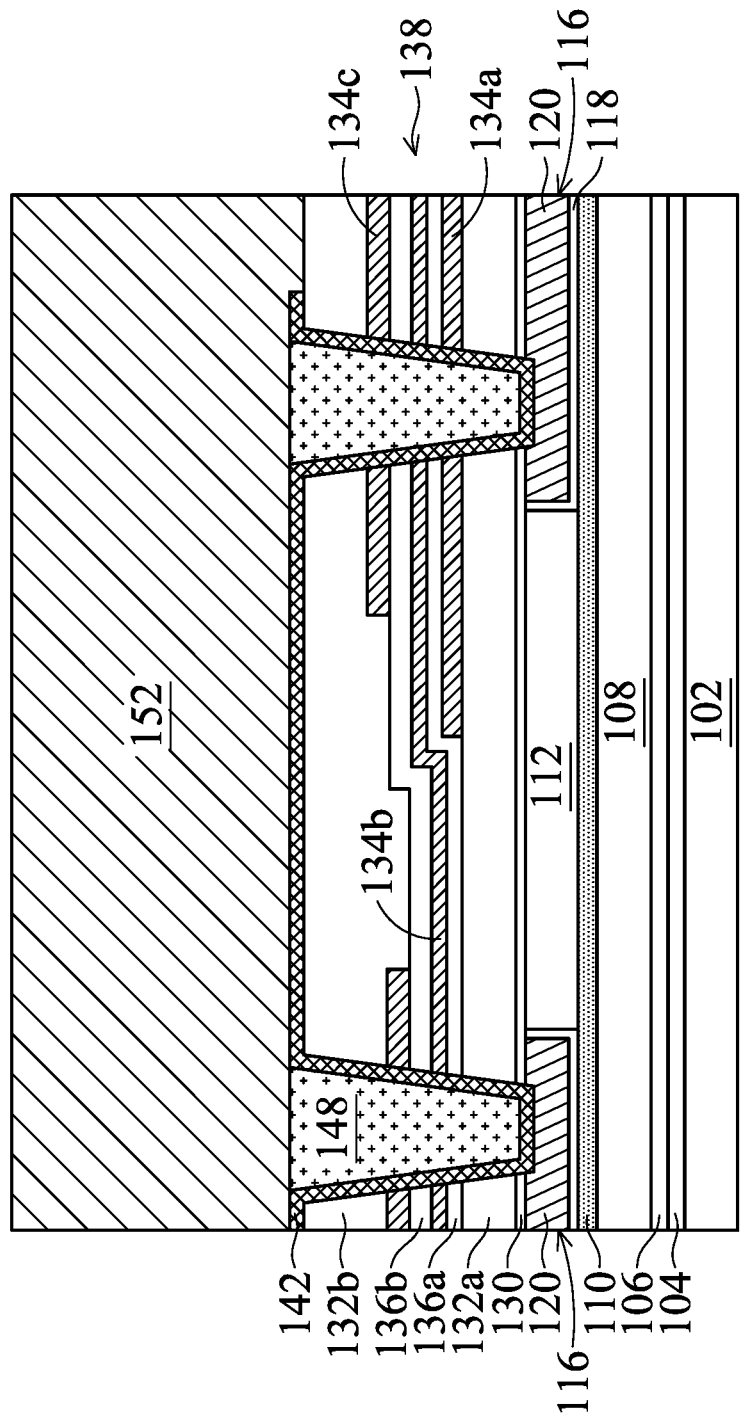
Figure 3E:
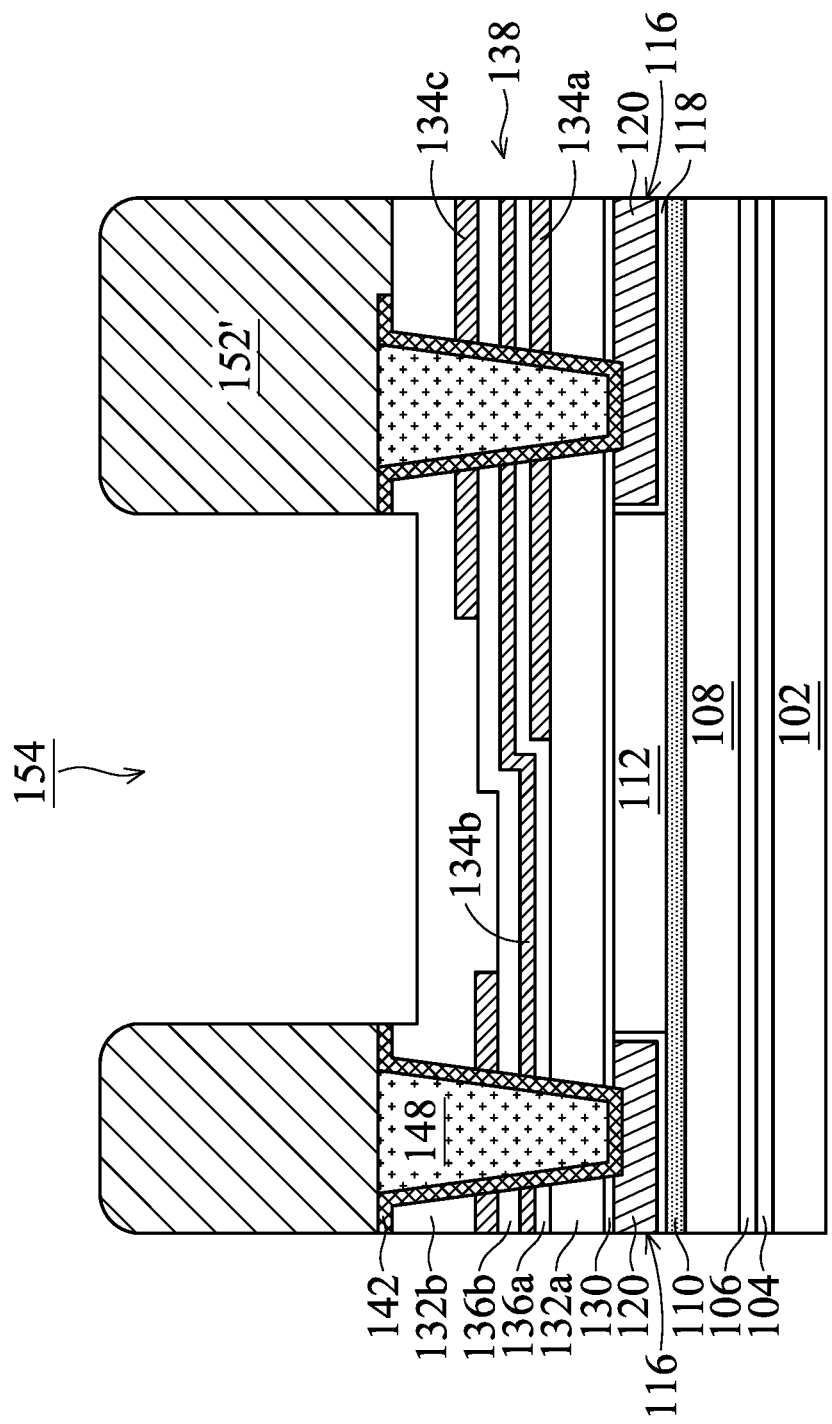
Figure 3F:
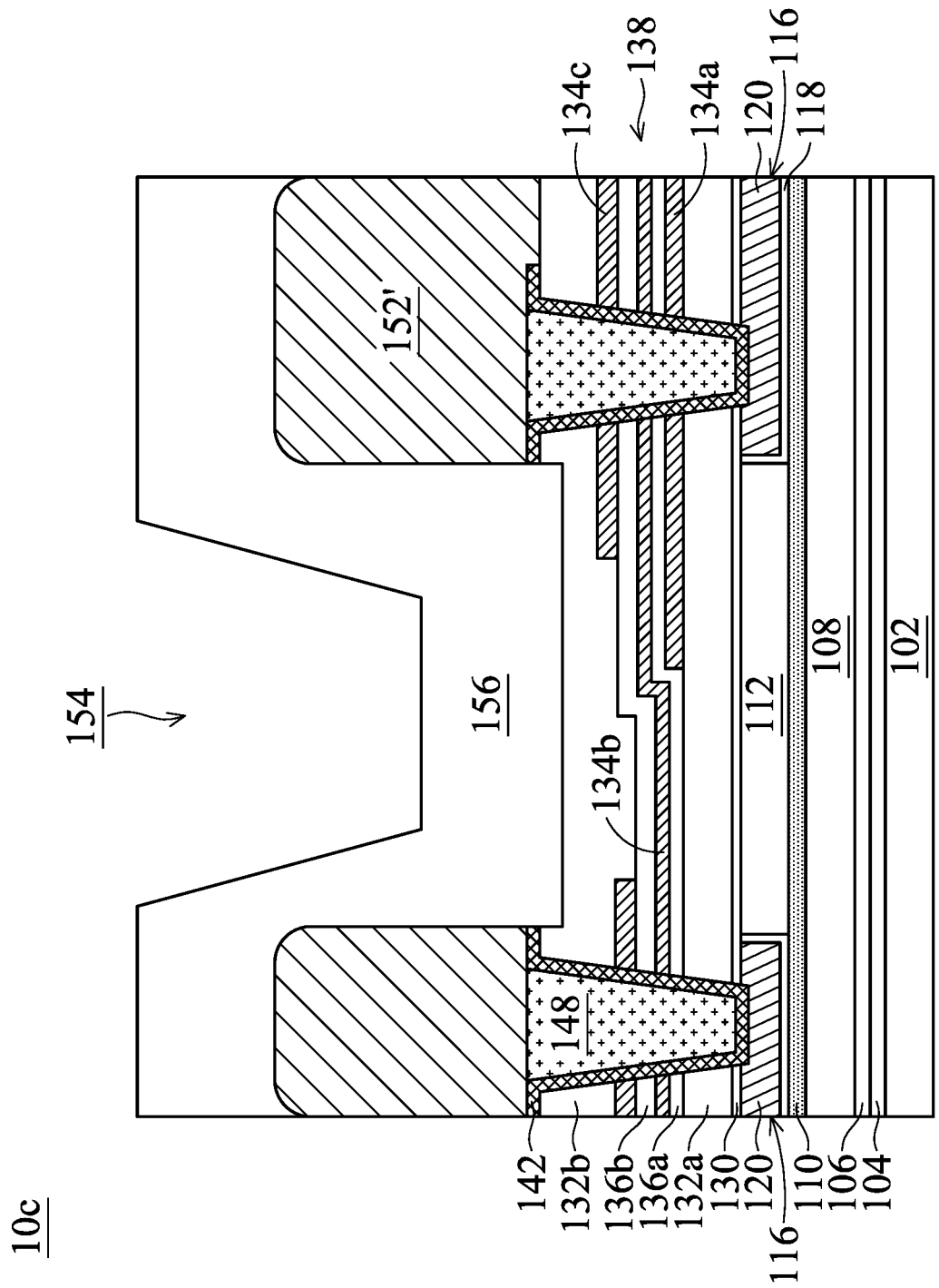

Afterwards, a portion of the barrier layer 142 is removed to reduce the resistance and an opening 150 is formed, as shown in FIG. 3C in accordance with some embodiments. An RDL material 152 is deposited over the via structure 148 and the first passivation layer 132b and in the opening 150, as shown in FIG. 3D in accordance with some embodiments. The RDL material 152 is patterned and the RDL structure 152' is formed over the via structure 148 and an opening 154 is formed between the RDL structures 152', as shown in FIG. 3E in accordance with some embodiments. A second passivation layer 156 is conformally formed over the RDL structure 152' and in the opening 154, as shown in FIG. 3F in accordance with some embodiments.

The processes and materials for forming the RDL material 152 and the second passivation layer 156 may be the same as, or similar to, those used to form the RDL material 152 and the second passivation layer 156 in the previous embodiments. For the purpose of brevity, the descriptions of these processes and materials are not repeated herein.

By forming the via structure 148 and the RDL structure 152' separately, The RDL structure 152' may have a flat top surface, and the RDL structure 152' may be more robust and there may be no seam formed in the RDL structure 152'. The reliability may be improved. Therefore, the MIM structure 138 may be more robust. The via structure material 146 may be conformally formed by PVD or CVD and planarizing to form the via structure 148. The via structure material 146 may be directly formed over the barrier layer 142.

Many variations and/or modifications may be made to the embodiments of the disclosure. FIGS. 4A-4I are cross-sectional representations of various stages of forming a semiconductor structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, an etch stop layer 402 is conformally formed in the opening 140 and over the first passivation layer 132b.

Figure 4A:
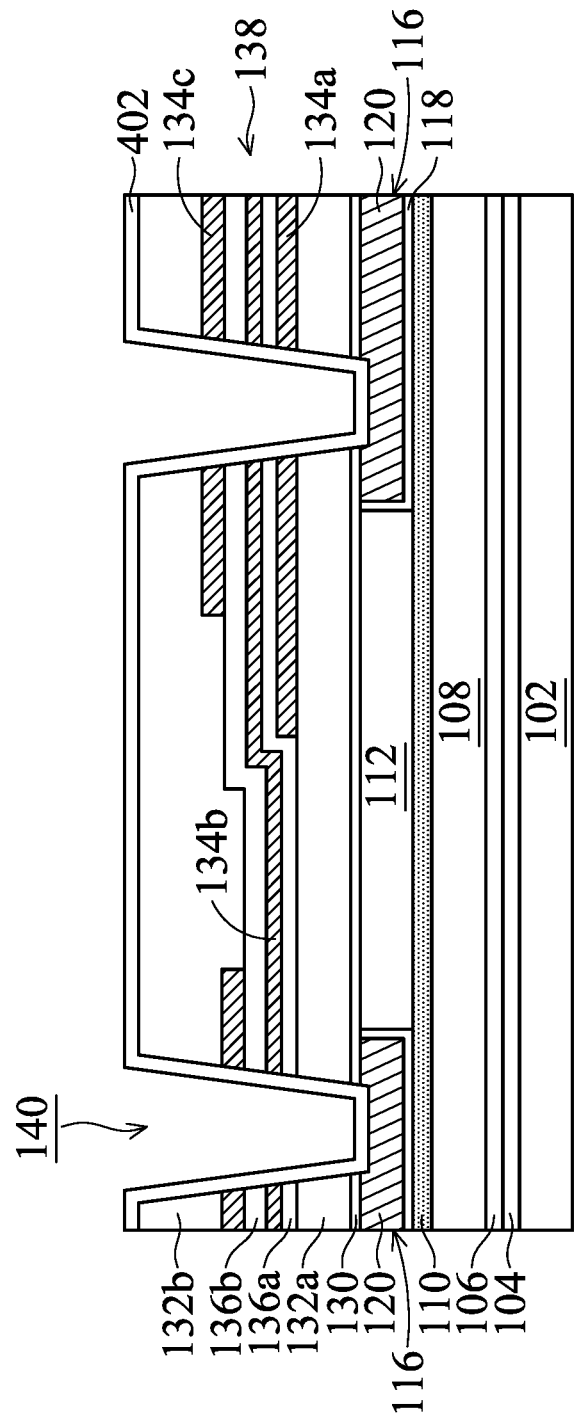
FIGS. 4A-4I are cross-sectional representations of various stages of forming a semiconductor structure, in accordance with some embodiments of the disclosure.

After the opening 140 is formed, an etch stop layer 402 is formed over sidewalls and the bottom surface of the opening 140 and over the first passivation layer 132b, as shown in FIG. 4A in accordance with some embodiments. The etch stop layer 402 may include nitrogen or carbon containing material such as silicon carbon nitride (SiCN), silicon oxycarbide (SiOC), silicon carbide (SiC), silicon oxycarbonitride (SiOCN), silicon nitride (SiN), other applicable materials, or a combination thereof. The etch stop layer 402 may be formed by CVD, PVD, ALD, other applicable processes, or a combination thereof.

Figure 4B:
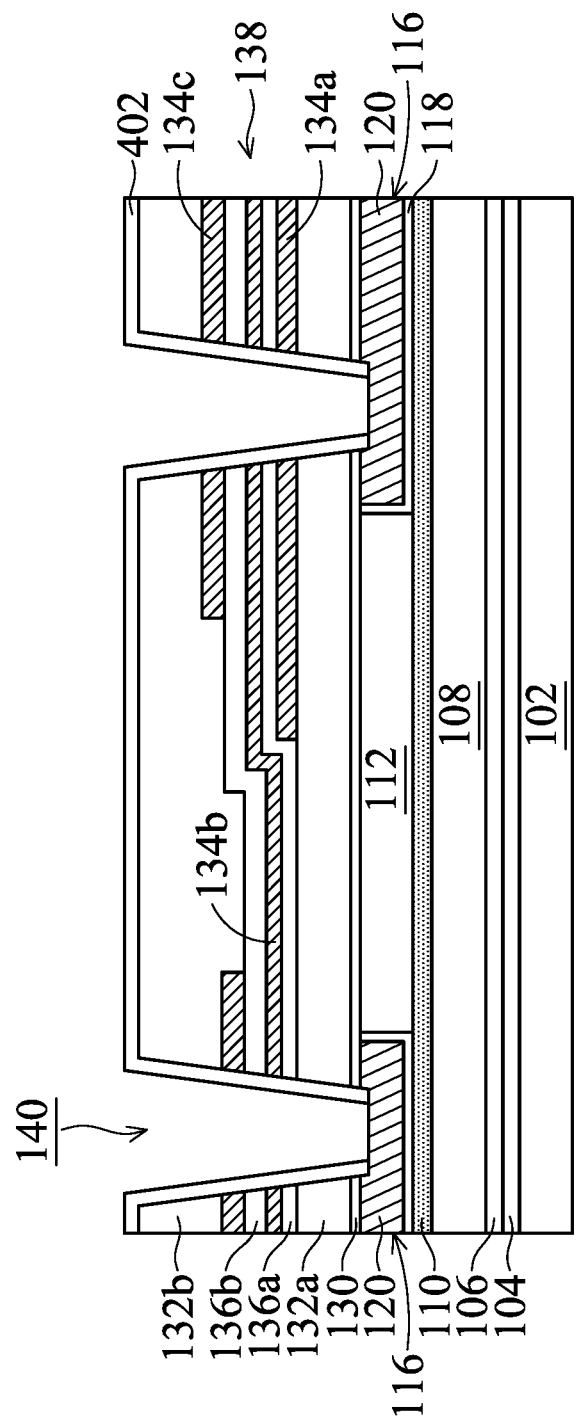

Next, the etch stop layer 402 over the bottom surface of the opening 140 is removed, as shown in FIG. 4B in accordance with some embodiments. The conductive material 120 of the top metal layer 116 may be exposed in the opening 140. The etch stop layer 402 may be removed by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process.

Figure 4C:
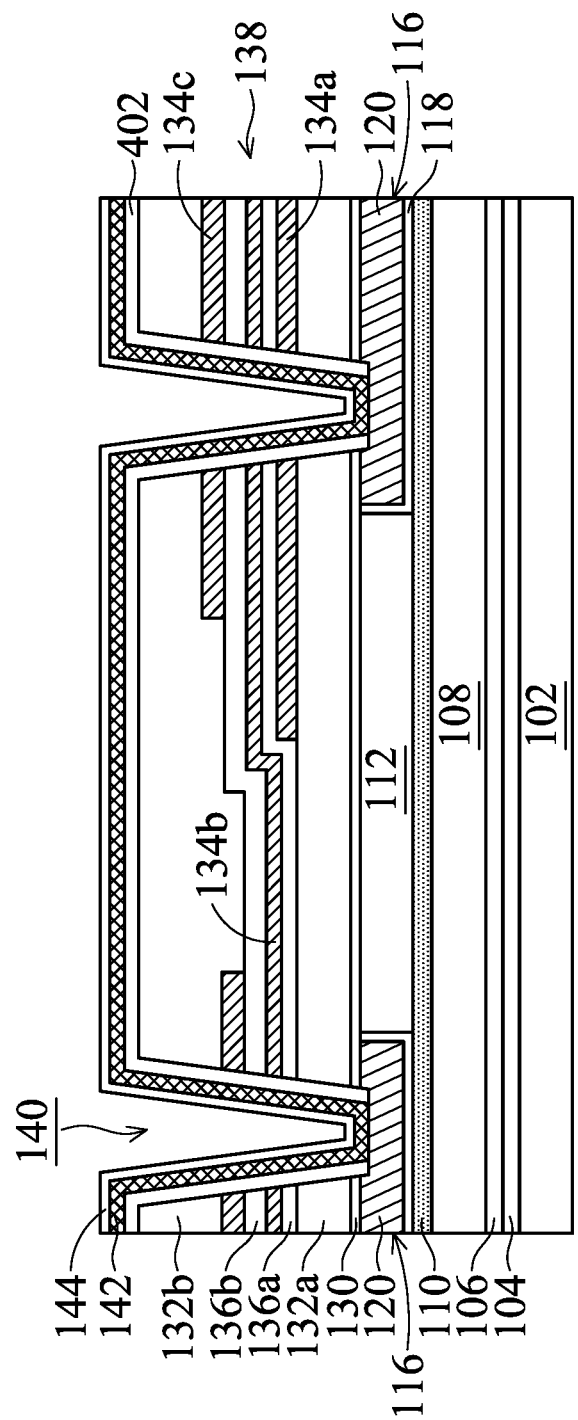

Next, a barrier layer 142 is conformally formed in the opening 140, and a seed layer 144 is conformally formed over the barrier layer 142, as shown in FIG. 4C in accordance with some embodiments. In some embodiment, the barrier layer 142 is in contact with the conductive material 120 of the top metal layer 116. The processes and materials for forming the barrier layer 142 and the seed layer 144 may be the same as, or similar to, those used to form the barrier layer 142 and the seed layer 144 in the previous embodiments. For the purpose of brevity, the descriptions of these processes and materials are not repeated herein.

Figure 4D:
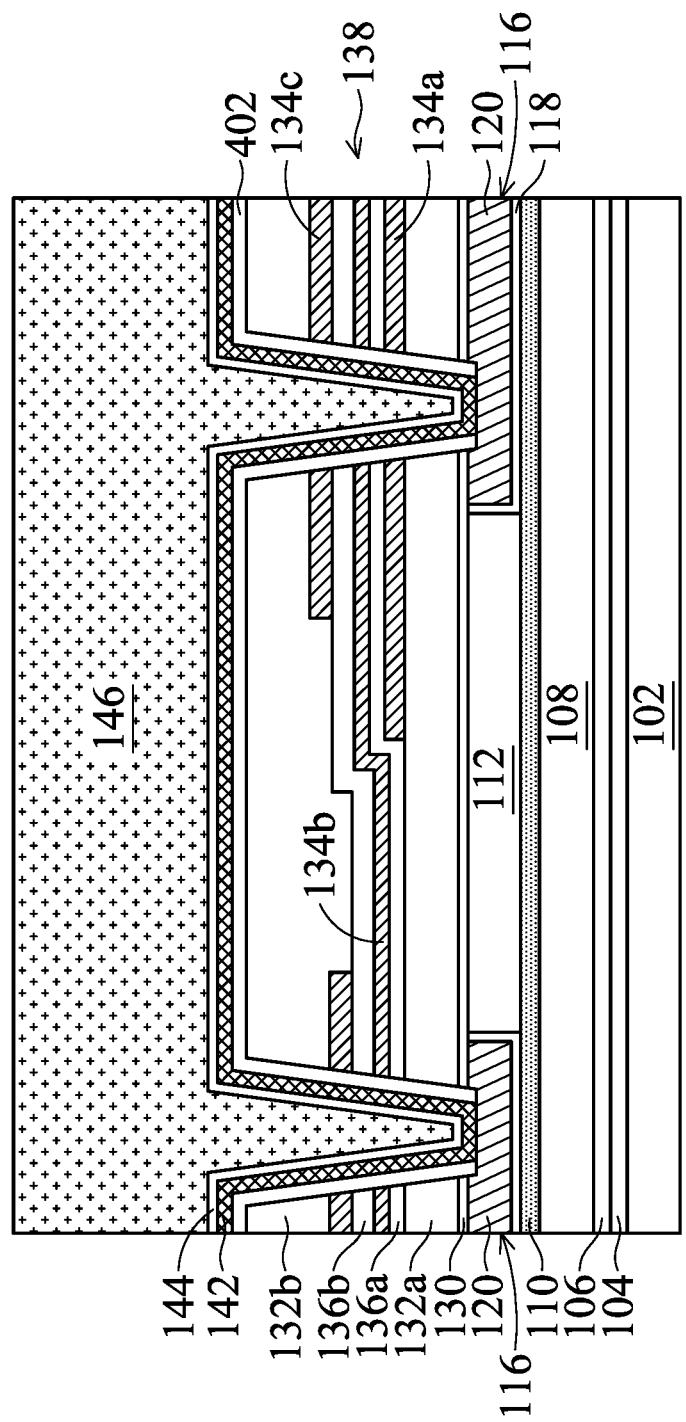

Next, the via material 146 is formed in the opening 140 and over the seed layer 144, as shown in FIG. 4D in accordance with some embodiments. In some embodiments, the via material 146 has a flat surface. The via material 146 may be formed by an ECP process.

Figure 4E:
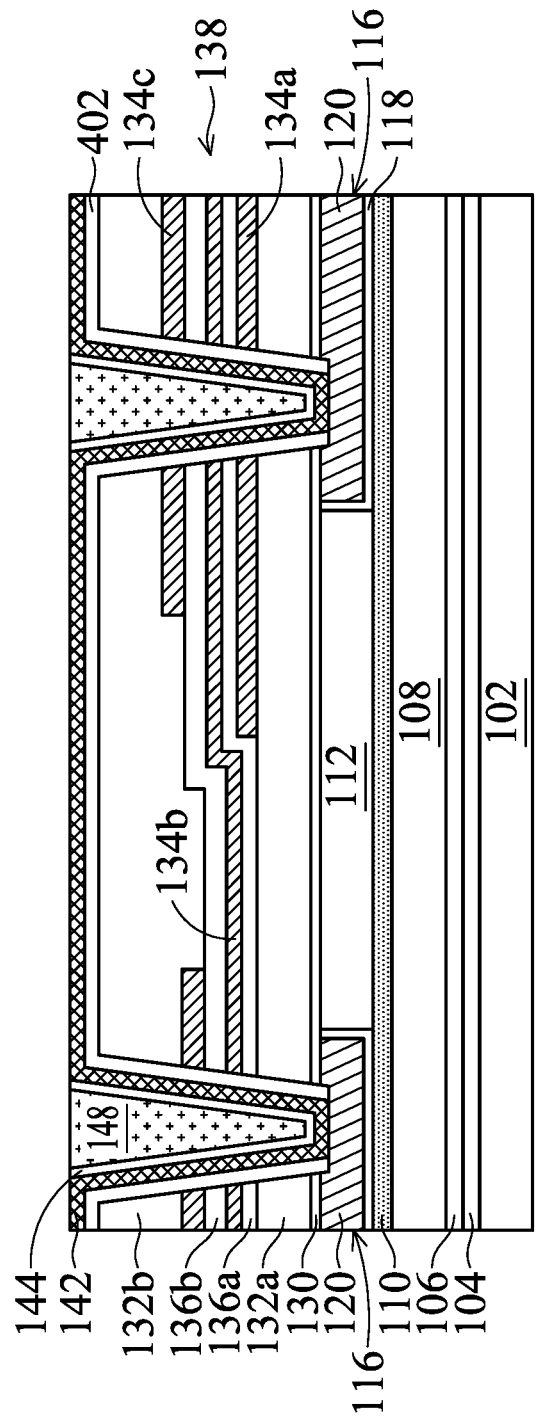

Next, a planarization process is performed and the seed layer 144 over the barrier process 142 is removed, as shown in FIG. 4E in accordance with some embodiments. The via structure 148 may be formed in the opening 140. The barrier layer 142 over the first passivation layer 132b is exposed after the planarization process. In some embodiments, the etch stop layer 402 is formed over sidewalls of the via structure 148 and the top surface of the first passivation layer 132b.

Figure 4F:
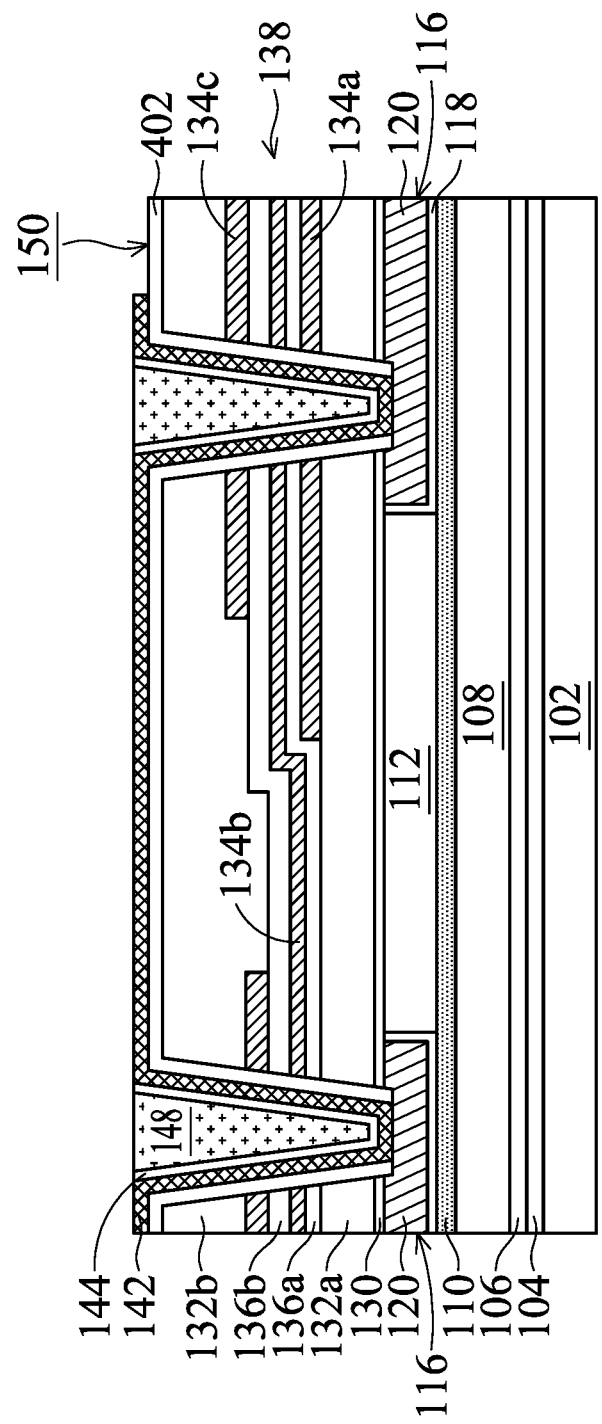
Figure 4G:
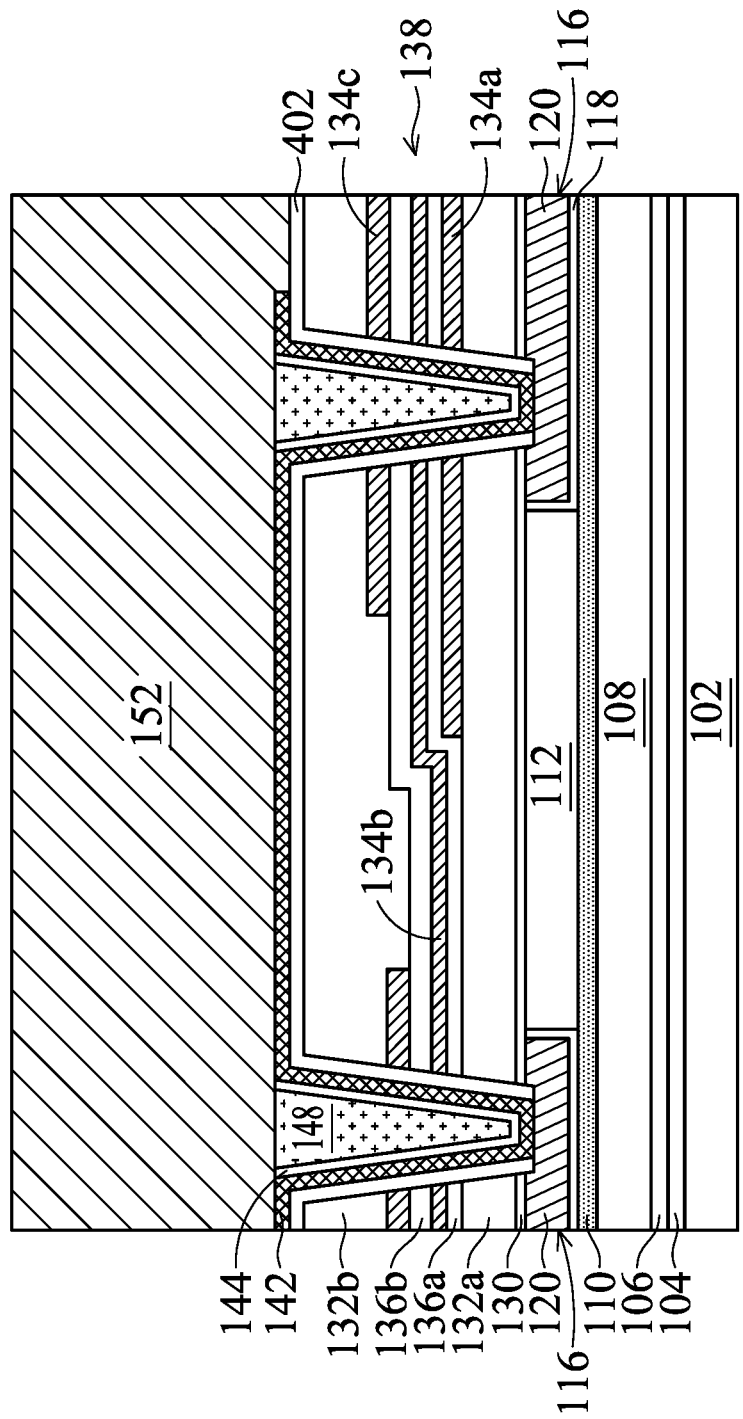

Afterwards, a portion of the barrier layer 142 is removed to reduce the resistance and an opening 150 is formed, as shown in FIG. 4F in accordance with some embodiments. In some embodiments, the etch stop layer 402 is exposed in the opening 150. An RDL material 152 is deposited over the via structure 148 and the first passivation layer 132b and in the opening 150, as shown in FIG. 4O in accordance with some embodiments.

Figure 4H:
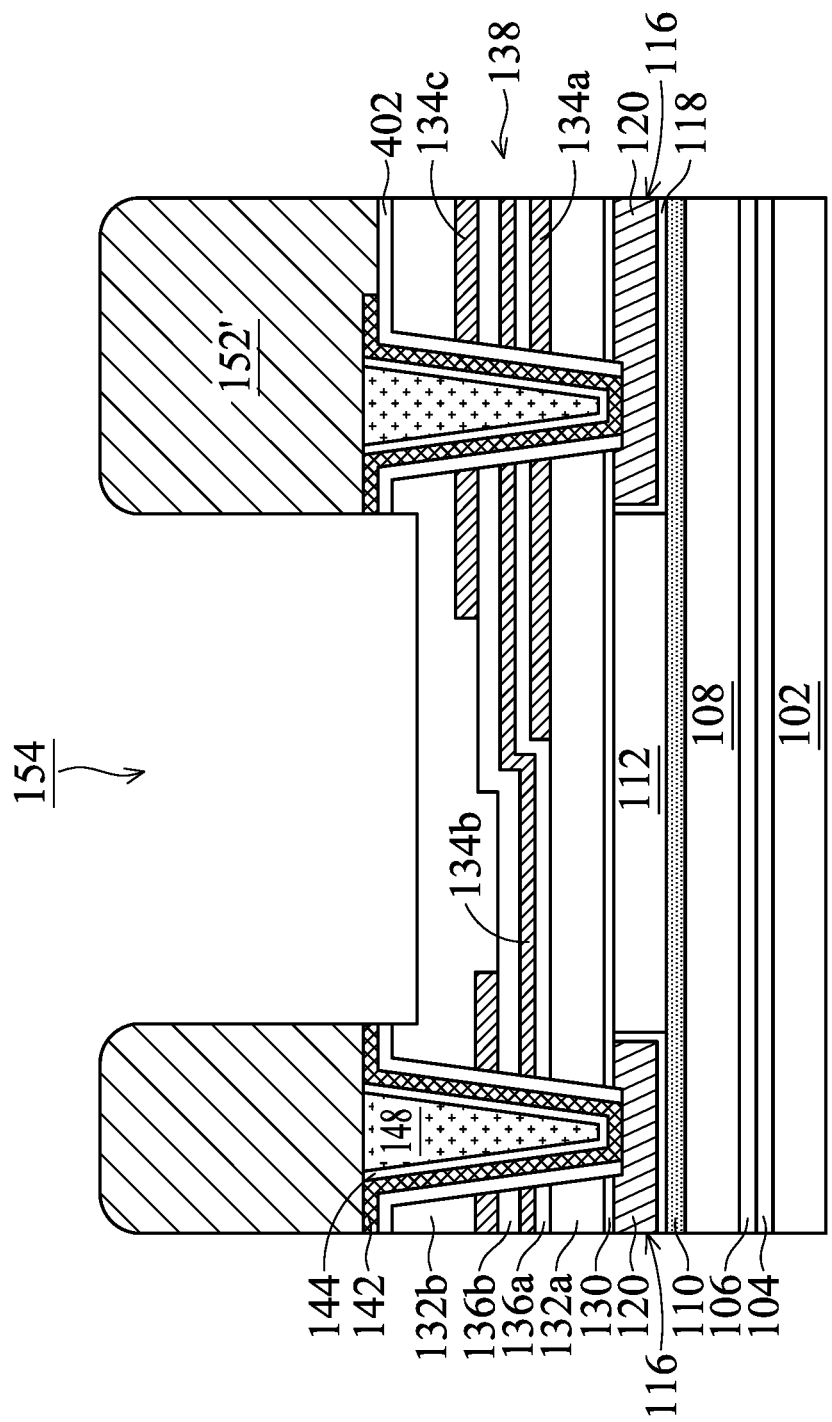

Next, an opening 154 is formed in the RDL material 152 and RDL structures 152' are formed, as shown in FIG. 4H in accordance with some embodiments. The opening 154 may be formed by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. The etching process may be stopped at the etch stop layer 402. Therefore, the first passivation layer 132b may not be over-etched.

Figure 4I:
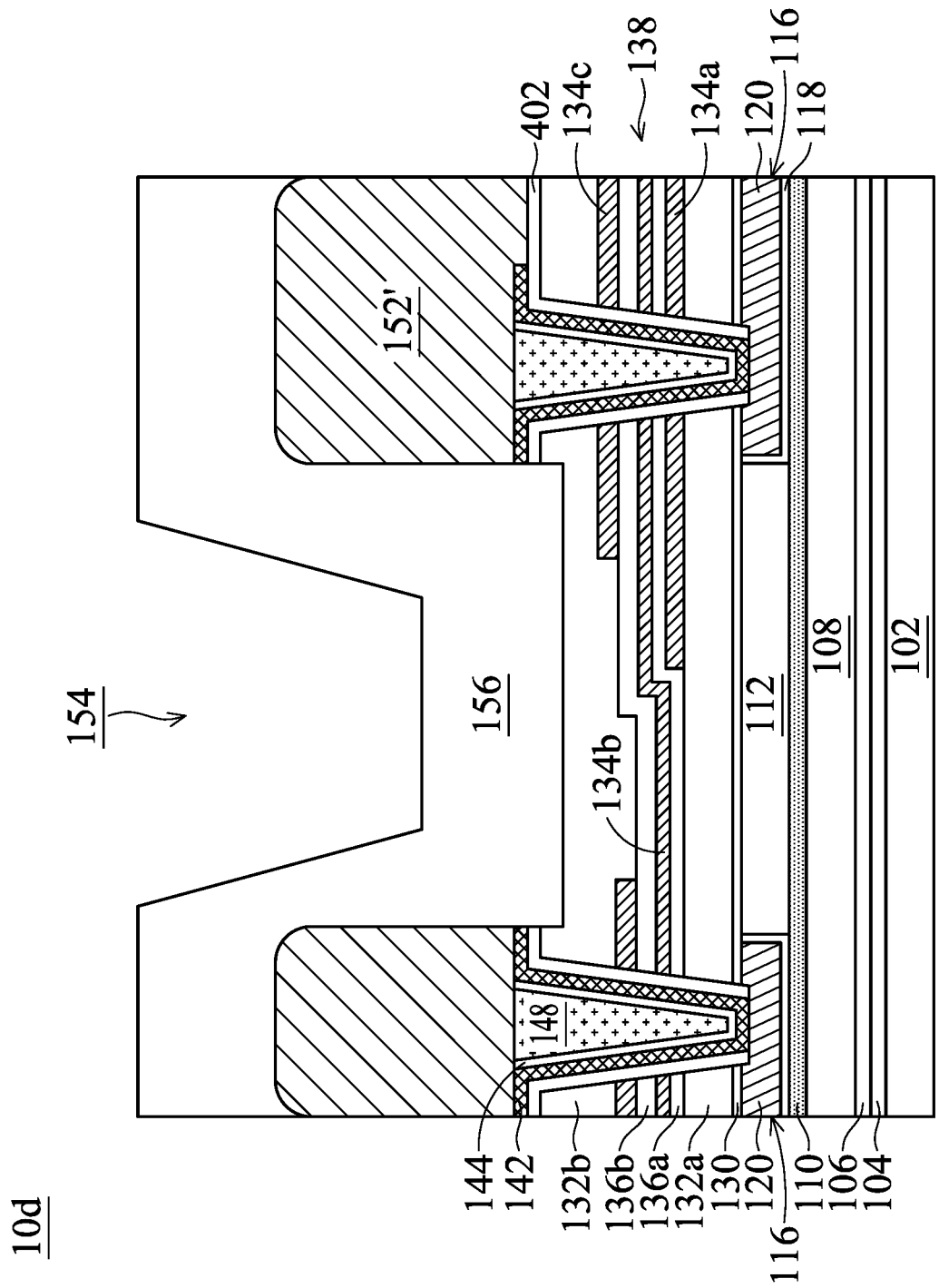

Afterwards, the second passivation layer 156 is formed over the RDL structure 152' and in the opening 154, as shown in FIG. 4I in accordance with some embodiments. The processes and materials for forming the second passivation layer 156 may be the same as, or similar to, those used to form the second passivation layer 156 in the previous embodiments. For the purpose of brevity, the descriptions of these processes and materials are not repeated herein.

By forming the via structure 148 and the RDL structure 152' separately, The RDL structure 152' may have a flat top surface, and the RDL structure 152' may be more robust and there may be no seam formed in the RDL structure 152'. The reliability may be improved. In addition, the first passivation layer 132a and 132b may be thicker by using electrochemical plating (ECP) deposition process forming the via structure material 146. Therefore, the MIM structure 138 may be more robust. The etch stop layer 402 may help to prevent the first passivation layer 132b from being over-etched.

Figure 5A:
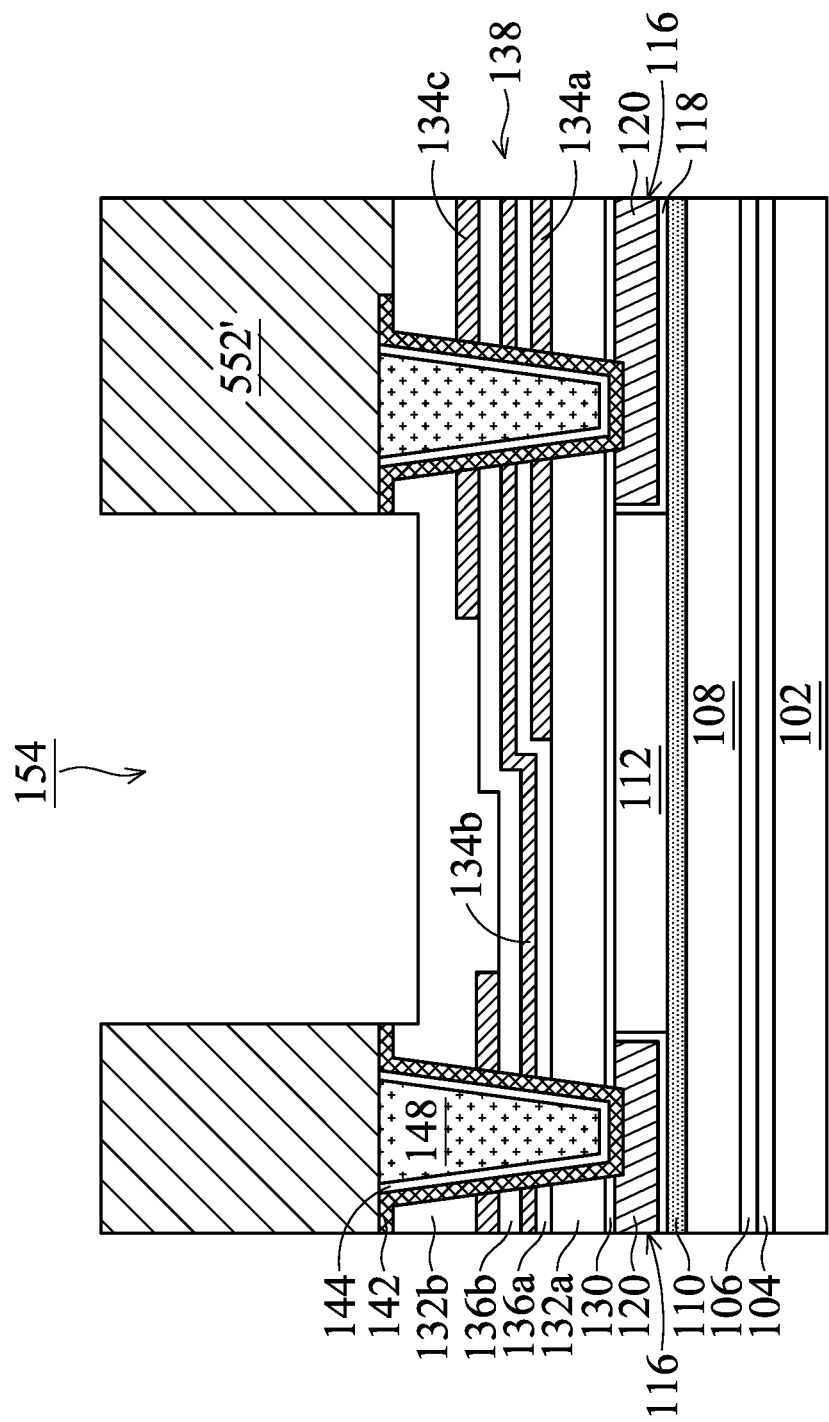
FIGS. 5A-5B are cross-sectional representations of various stages of forming a semiconductor structure, in accordance with some embodiments of the disclosure.
Figure 5B:
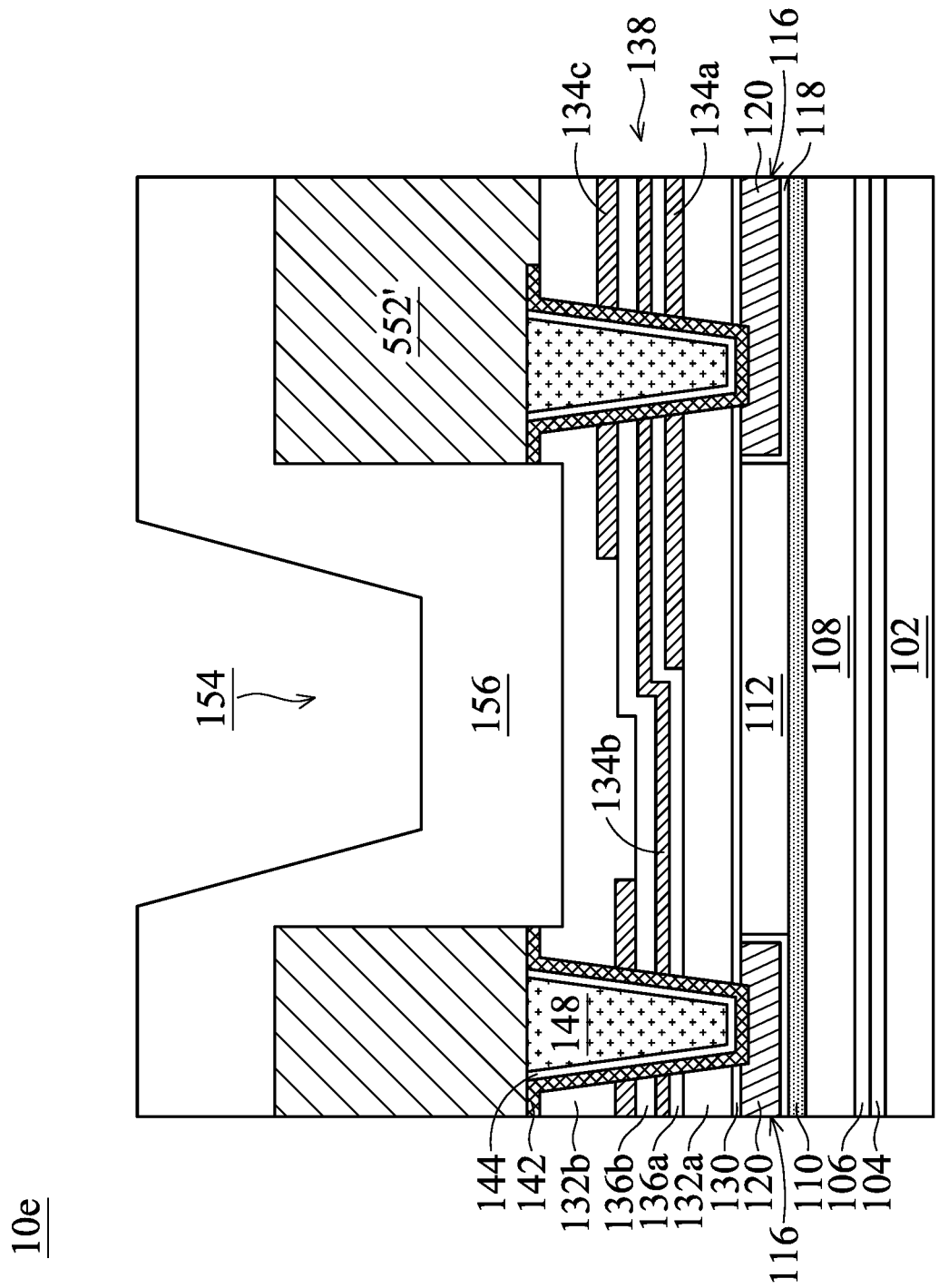

Many variations and/or modifications may be made to the embodiments of the disclosure. FIGS. 5A-5B are cross-sectional representations of various stages of forming a semiconductor structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the RDL structure 552' has a flat top surface with right angles.

By modifying the bombardment step in the etching process of forming the RDL structure 552', the angle shape of the RDL structure 552' may be modified. For example, if the energy and intensity of the bombardment step of etching the RDL material 152 is increased, the corner of the RDL structure 552' may be sharper.

Afterwards, the second passivation layer 156 is formed over the RDL structure 552' and in the opening 154, as shown in FIG. 5B in accordance with some embodiments. The processes and materials for forming the second passivation layer 156 may be the same as, or similar to, those used to form the second passivation layer 156 in the previous embodiments. For the purpose of brevity, the descriptions of these processes and materials are not repeated herein.

By forming the via structure 148 and the RDL structure 152' separately, The RDL structure 152' may have a flat top surface, and the RDL structure 152' may be more robust and there may be no seam formed in the RDL structure 152'. The reliability may be improved. In addition, the first passivation layer 132a and 132b may be thicker by using electrochemical plating (ECP) deposition process forming the via structure material 146. Therefore, the MIM structure 138 may be more robust. The corner shape of the RDL structure 552' may be modified by modifying the bombardment process when forming the RDL structure 552'.

Many variations and/or modifications may be made to the embodiments of the disclosure. FIGS. 6-1, 6-2, 6-3 and 6-4 are top views of a semiconductor structures, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the MIM structures 138 may vary.

Figures 3, 6:
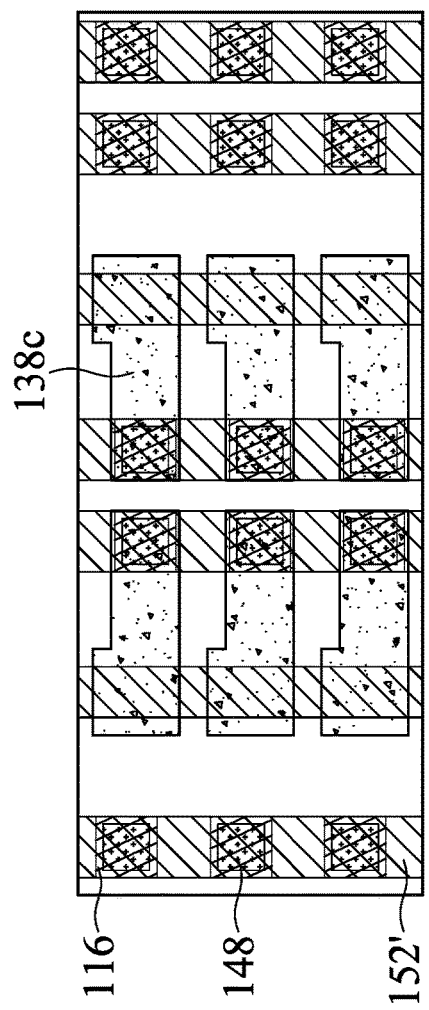
Figures 4, 6:
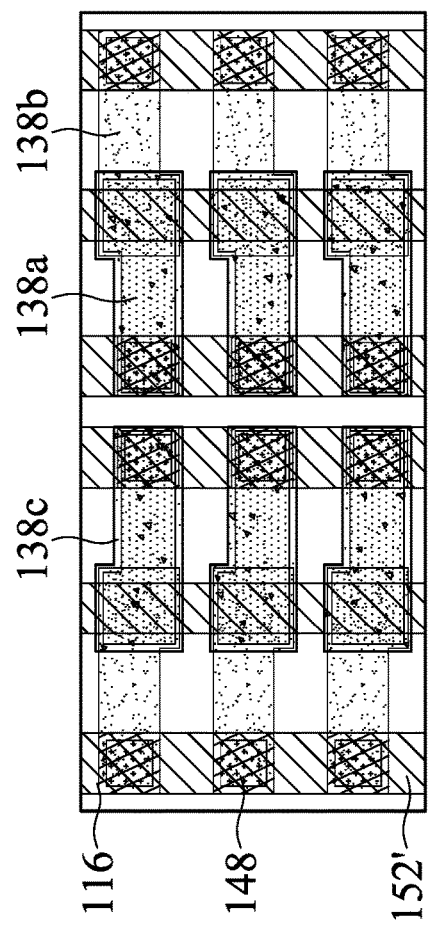

In some embodiments, as shown in FIG. 6-1, the MIM structure 138a is connected to the via structure 148. In some embodiments, as shown in FIG. 6-2, the MIM structure 138b is connected to the via structure 148. In some embodiments, as shown in FIG. 6-3, the MIM structure 138c is connected to the via structure 148. In some embodiments, as shown in FIG. 6-4, the MIM structures 138a, 138b, and 138c are connected to the via structure 148. The MIM structures 138a, 138b, and 138c may have different shapes in the top view, and may be connected to the via structure 148.

It should be noted that, the numbers and the shapes of the MIM structures 138 are merely an example, and not limited thereto. The MIM structures 138 may have any layer numbers and in any shape, depending on design requirements.

By forming the via structure 148 and the RDL structure 152' separately, The RDL structure 152' may have a flat top surface, and the RDL structure 152' may be more robust and there may be no seam formed in the RDL structure 152'. The reliability may be improved. In addition, the first passivation layer 132a and 132b may be thicker by using an electrochemical plating (ECP) deposition process for forming the via structure material 146. Therefore, the MIM structure 138 may be more robust. The MIM structure 138 connected to the via structure 148 may have a different shape or a different number of layers.

As described previously, the via structure 148 and the RDL structure 152' are formed separately. The top surface of the RDL structure 152' may be flat and the RDL structure 152' may be robust. When the via structure 148 is formed by electro-chemical plating (ECP), the thickness of the first passivation layers 132a and 132b are not limited and the MIM structure 138 may be robust. In some embodiments, as shown in FIG. 2, a bump structure 204 is formed over the RDL structure 152'. In some embodiments, as shown in FIG. 3A, the via structure 148 is formed by PVD or CVD, and the recess 302 is formed in the via structure material 146 over the opening 140. In some embodiments, as shown in FIG. 4H, the etching process of forming the RDL structure 152' is stopped at the etch stop layer 402. In some embodiments, as shown in FIG. 5A, the top corner of the RDL structure 152' has a right angle.

Embodiments of a semiconductor structure and a method for forming the same are provided. The via structure may be formed first and the RDL structure may be formed later. The RDL structure may have a flat top surface so that the RDL structure is more robust and the reliability may be improved. The thickness of the passivation layer may not be limited and the MIM structure may be more robust.

In some embodiments, a method for forming a semiconductor structure is provided. The method for forming a semiconductor structure includes forming a metal-insulator-metal (MIM) structure between first passivation layers over a substrate. The method for forming a semiconductor structure also includes forming a via structure through the MIM structure and the first passivation layers. The method for forming a semiconductor structure also includes planarizing the via structure. The method for forming a semiconductor structure also includes forming an RDL structure over the via structure. The method for forming a semiconductor structure also includes forming a second passivation layer over the RDL structure and the first passivation layers.

In some embodiments, a method for forming a semiconductor structure is provided. The method for forming a semiconductor structure includes forming a conductive feature over a substrate. The method for forming a semiconductor structure includes forming a metal-insulator-metal (MIM) structure sandwiched between first passivation layers over the conductive feature. The method for forming a semiconductor structure includes forming an opening through the MIM structure and the first passivation layers exposing the conductive feature. The method for forming a semiconductor structure includes depositing a via material in the opening and over the first passivation layers. The method for forming a semiconductor structure includes planarizing the via material to form a via structure in the opening. The method for forming a semiconductor structure includes depositing an RDL material over the via structure and first passivation layers. The method for forming a semiconductor structure includes patterning the RDL material to form an RDL structure in direct contact with the via structure. The method for forming a semiconductor structure includes forming a second passivation layer over the RDL structure and the MIM structure.

In some embodiments, a semiconductor structure is provided. The semiconductor structure includes a metal-insulator-metal (MIM) structure sandwiched between first passivation layers over a substrate. The semiconductor structure also includes via structures formed through the MIM structure and the first passivation layers. The semiconductor structure also includes RDL structures formed over the via structures. The semiconductor structure also includes a second passivation layer formed between and over the RDL structures. The RDL structures have flat top surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A method for forming a semiconductor structure, comprising:
   forming a metal-insulator-metal (MIM) structure between first passivation layers over a substrate;

forming an etch stop layer through the MIM structure and the first passivation layers;
forming a barrier layer on the etch stop layer;
forming a first via structure and a second via structure through the etch stop layer and the barrier layer, wherein the first via structure is adjacent to the second via structure;
planarizing the first via structure and the second via structure;
removing a portion of the barrier layer to expose a portion of the etch stop layer, wherein the barrier layer continuously extends between the first via structure and the second via structure after the portion of the barrier layer is removed;
forming a redistribution layer (RDL) structure over the first via structure and the second via structure, wherein the RDL structure has a first bottom surface directly on the first via structure and the second via structure and a second bottom surface directly on the etch stop layer, and the first bottom surface is higher than the second bottom surface; and
forming a second passivation layer over the RDL structure and the first passivation layers.

2. The method for forming a semiconductor structure as claimed in claim 1, wherein the via structure is formed by electro-chemical plating.

3. The method for forming a semiconductor structure as claimed in claim 1, wherein the first passivation layers are recessed when forming the RDL structure.

4. The method for forming a semiconductor structure as claimed in claim 1, wherein the second passivation layer is conformally formed over the RDL structure and the first passivation layers.

5. The method for forming a semiconductor structure as claimed in claim 1, wherein a portion of a top surface of the RDL structure is flat.

6. The method for forming a semiconductor structure as claimed in claim 1, wherein top corners of the RDL structure are rounded when forming the RDL structure.

7. The method for forming a semiconductor structure as claimed in claim 1, wherein the first passivation layers have a first top surface interfacing the etch stop layer and a second top surface and a sidewall interfacing the second passivation layer, and the first top surface is higher than the second top surface.

8. A method for forming a semiconductor structure, comprising:
forming a conductive feature over a substrate;
forming a metal-insulator-metal (MIM) structure sandwiched between first passivation layers over the conductive feature;
forming an opening through the MIM structure and the first passivation layers exposing the conductive feature;
forming a barrier layer over sidewalls and a bottom surface of the opening and over a top surface of the first passivation layers;
depositing a via material in the opening and over the first passivation layers;
planarizing the via material to form a via structure in the opening;
removing a portion of the barrier layer over the top surface of the first passivation layers;
depositing an RDL material over the via structure and first passivation layers, wherein the portion of the barrier layer is removed after planarizing the via material and before depositing the RDL material;
patterning the RDL material to form an RDL structure in direct contact with the via structure; and
forming a second passivation layer over the RDL structure and the MIM structure.

9. The method for forming a semiconductor structure as claimed in claim 8, further comprising:
forming the barrier layer over sidewalls and a bottom surface of the opening and over a top surface of the first passivation layers; and
forming a seed layer over the barrier layer.

10. The method for forming a semiconductor structure as claimed in claim 9, further comprising:
removing the seed layer over the top surface of the first passivation layers when planarizing the via material.

11. The method for forming a semiconductor structure as claimed in claim 9, further comprising:
removing a portion of the barrier layer over the top surface of the first passivation layers.

12. The method for forming a semiconductor structure as claimed in claim 9, wherein the seed layer and the barrier layer are made of different materials.

13. The method for forming a semiconductor structure as claimed in claim 8, further comprising:
forming a first etch stop layer between the conductive feature and the first passivation layers.

14. The method for forming a semiconductor structure as claimed in claim 13, wherein the first passivation layers have a first top surface interfacing the first etch stop layer and a second top surface and a sidewall interfacing the second passivation layer, and the first top surface is higher than the second top surface.

15. The method for forming a semiconductor structure as claimed in claim 8, wherein a recess is formed in the via material.

16. The method for forming a semiconductor structure as claimed in claim 8, further comprising:
forming a second etch stop layer over sidewalls and a bottom surface of the opening and over a top surface of the first passivation layers; and
removing the second etch stop layer over the bottom surface of the opening.

17. A method for forming a semiconductor structure, comprising:
forming a metal-insulator-metal (MIM) structure sandwiched between first passivation layers over a substrate;
forming an etch stop layer through the MIM structure and the first passivation layers;
forming via structures through the etch stop layer;
forming redistribution layer (RDL) structures over the via structures, wherein a first interface between the RDL structures and the via structures is higher than a second interface between the RDL structures and the etch stop layer; and
forming a second passivation layer between the RDL structures,
wherein the RDL structures have flat top surfaces, wherein the first passivation layers have a first top surface interfacing the etch stop layer and a second top surface and a sidewall interfacing the second passivation layer, and the first top surface is higher than the second top surface.

18. The method for forming the semiconductor structure as claimed in claim 17, further comprising:
forming a barrier layer between the etch stop layer and the via structures; and removing a portion of the barrier layer to expose a portion of the etch stop layer, wherein the barrier layer continuously extends between a bottom surface of a first via structure of the via structures and a second via structure of the via structures after the portion of the barrier layer is removed.

19. The method for forming a semiconductor structure as claimed in claim 1, further comprising:

forming the barrier layer between the etch stop layer and the via structure, wherein the RDL structure is in contact with the barrier layer and the etch stop layer.

20. The method for forming a semiconductor structure as claimed in claim 19, wherein the RDL structure is in contact with a top surface of the barrier layer and a sidewall of the barrier layer.

* * * * *